United States Patent
Hashimoto et al.

(10) Patent No.: US 7,785,112 B2
(45) Date of Patent: Aug. 31, 2010

(54) CONTACT AND ELECTRICAL CONNECTOR

(75) Inventors: Shinichi Hashimoto, Kanagawa (JP); Hiroshi Shirai, Saitama (JP)

(73) Assignee: Tyco Electronics AMP K. K., Kanagawa-Ken (JP)

( * ) Notice: Subject to any disclaimer, the term of this patent is extended or adjusted under 35 U.S.C. 154(b) by 81 days.

(21) Appl. No.: 12/089,319

(22) PCT Filed: Aug. 29, 2006

(86) PCT No.: PCT/JP2006/316984
§ 371 (c)(1),
(2), (4) Date: Apr. 4, 2008

(87) PCT Pub. No.: WO2007/043248
PCT Pub. Date: Apr. 19, 2007

(65) Prior Publication Data
US 2009/0042412 A1 Feb. 12, 2009

(30) Foreign Application Priority Data
Oct. 7, 2005 (JP) ............... 2005-295649

(51) Int. Cl.
H01R 12/00 (2006.01)
H05K 1/00 (2006.01)
(52) U.S. Cl. ....................................................... 439/66
(58) Field of Classification Search .............. 439/66, 439/81, 70, 71
See application file for complete search history.

(56) References Cited

U.S. PATENT DOCUMENTS

| | | | | |
|---|---|---|---|---|
| 5,957,703 A | * | 9/1999 | Arai et al. ............ | 439/66 |
| 5,997,315 A | * | 12/1999 | Akama et al. ......... | 439/66 |
| 6,375,474 B1 | | 4/2002 | Harper, Jr. et al. | |
| 6,695,624 B1 | * | 2/2004 | Szu ................... | 439/66 |
| 7,083,424 B2 | * | 8/2006 | Motohashi ........... | 439/66 |
| 2005/0020117 A1 | | 1/2005 | Motohashi | |
| 2005/0070135 A1 | | 3/2005 | Adachi et al. | |
| 2005/0208790 A1 | | 9/2005 | Asai | |

FOREIGN PATENT DOCUMENTS

| | | |
|---|---|---|
| JP | 2001-85131 | 3/2001 |
| JP | 2003-123924 | 4/2003 |
| JP | 2004-311264 | 11/2004 |
| JP | 2005-44545 | 2/2005 |
| JP | 2005-174901 | 6/2005 |
| JP | 2005-268019 | 9/2005 |
| JP | 2005-276779 | 10/2005 |

OTHER PUBLICATIONS

Chinese Patent Office Action dated Jun. 5, 2009 related to corresponding Chinese Patent Application No. 200680037140.X.

* cited by examiner

*Primary Examiner*—Javaid Nasri
(74) *Attorney, Agent, or Firm*—Barley Snyder LLC

(57) ABSTRACT

A contact includes a substantially rectangular base plate. A linking member extends from the base plate such that the linking member is perpendicular thereto. A first elastic contact arm extends obliquely upward from a tip end of the linking member. The first elastic contact arm has a contact member for electrically connecting the first elastic contact arm to an integrated circuit socket. A second elastic contact arm extends obliquely downward from a tip end of the linking member. The second elastic contact arm has a contact member for electrically connecting the second elastic contact arm to a circuit board.

6 Claims, 17 Drawing Sheets

F I G. 3
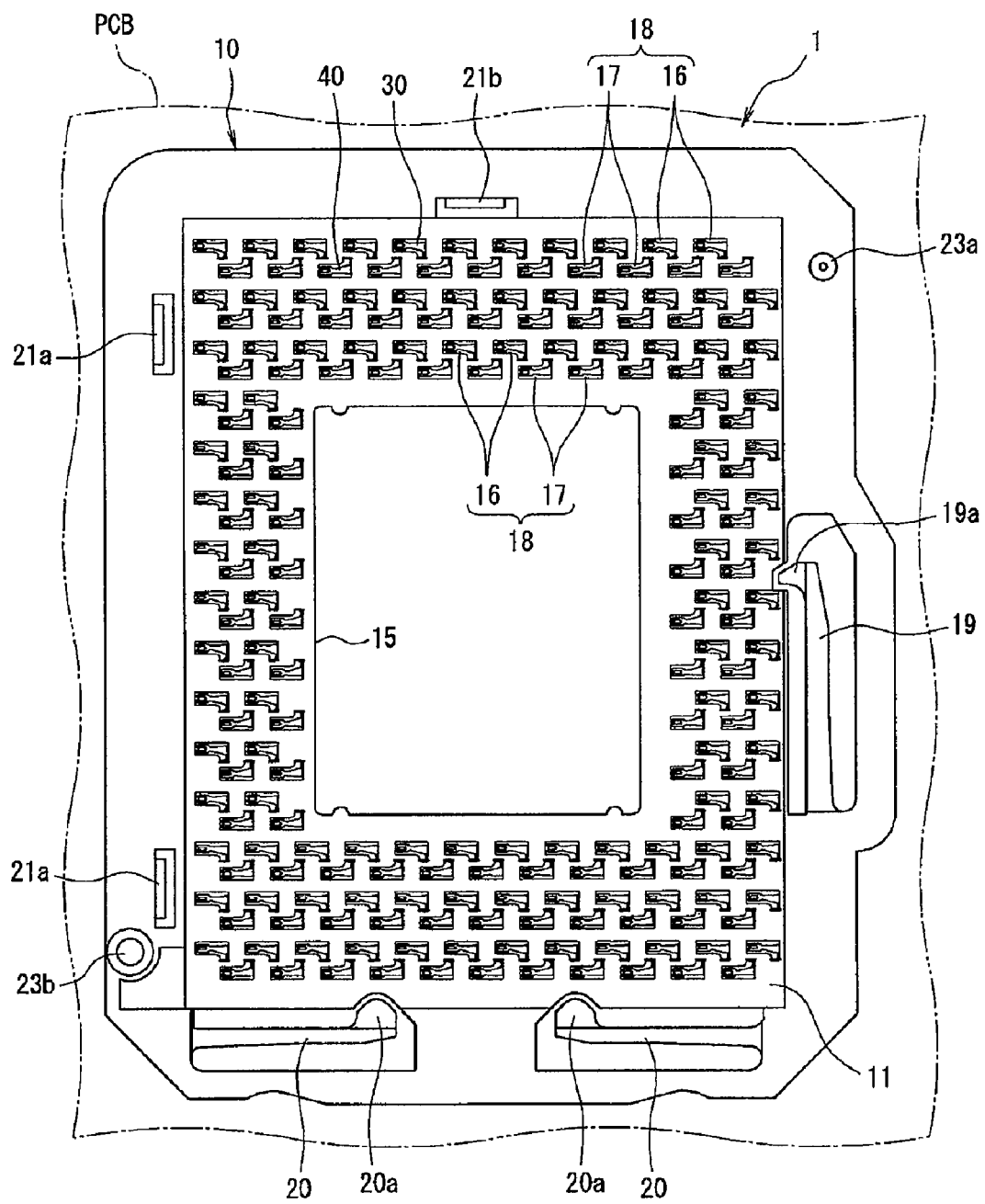

F I G. 13
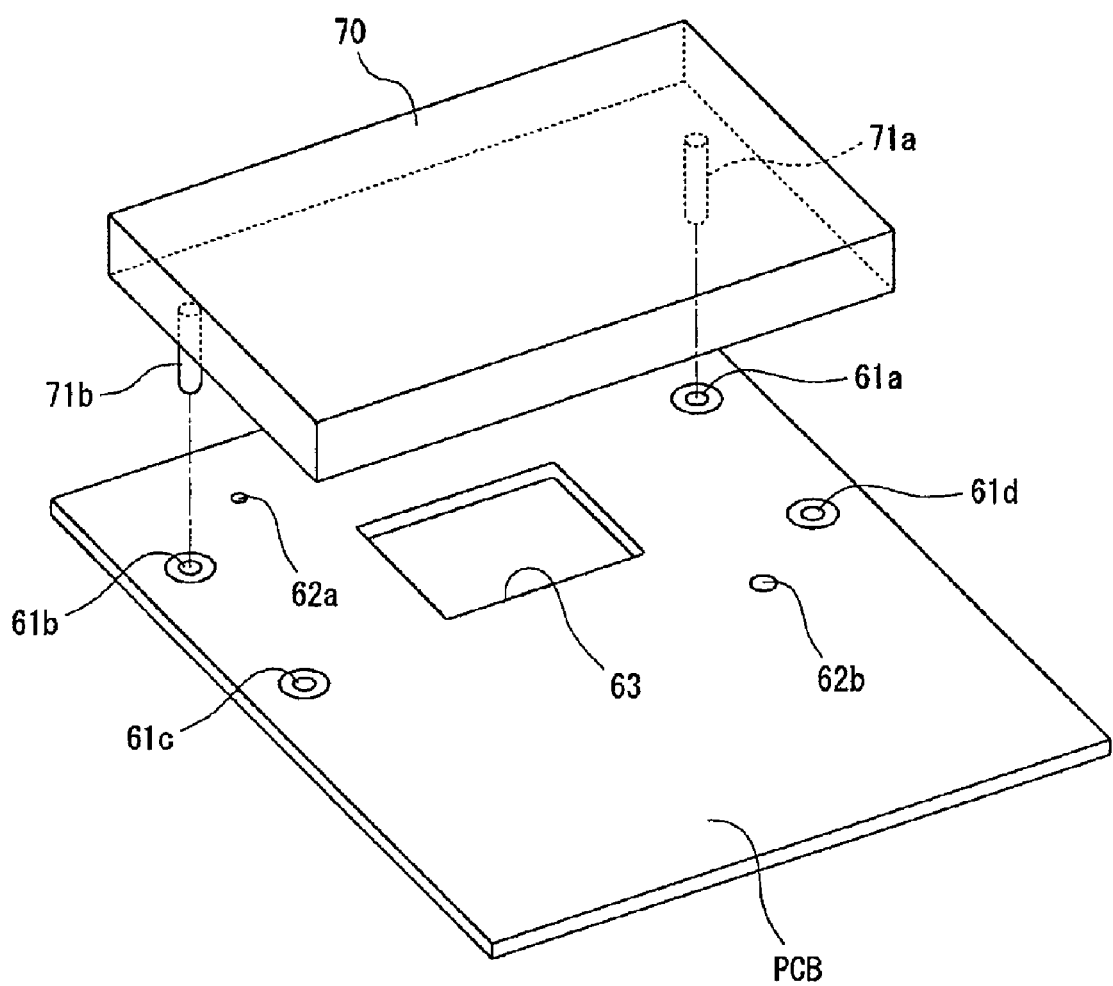

US 7,785,112 B2

CONTACT AND ELECTRICAL CONNECTOR

CROSS-REFERENCE TO RELATED APPLICATIONS

This application claims the benefit of the filing date under 35 U.S.C. §120 of PCT International Patent Application No. PCT/JP2006/316984 filed Aug. 29, 2006 that claims the benefit of Japanese Patent Application No. 2005-295649 filed Oct. 7, 2005.

FIELD OF THE INVENTION

The present invention relates to a contact and an electrical connector for electrically connecting an integrated circuit (IC) package installed with an IC such as a digital micromirror device (DMD) to a circuit board.

BACKGROUND

FIGS. 15 and 16 (see JP 2005-174901A) show, for example, a conventional electrical connector 101 for electrically connecting an IC package 130 to a circuit board 140. In FIGS. 15 and 16, the conventional electrical connector 101 comprises an insulating housing 110 and a plurality of contacts 120 secured to the housing 110. The housing 110 comprises a substantially rectangular plate-form base 111 that is mounted on the circuit board 140 and side walls 112 consisting of four sides rising from the edges of the base 111. A rectangular opening 117 is formed in a central portion of the base 111, and a plurality of contact accommodating cavities 118 are arranged in the form of a matrix so as to surround the opening 117. Furthermore, the space surrounded by the side walls 112 consisting of the four sides and the base 111 forms a package accommodating space 113 that accommodates the IC package 130. Moreover, elastic arms 114 are provided on two of the adjacent side walls 112 out of the four side walls 112.

As is shown in FIGS. 17A, 17B, 17C, 17D, and 17E, each contact 120 comprises a base plate 121 that is formed in a substantially rectangular plate form, a first elastic contact arm 122 that extends upward from the base plate 121, and a second elastic contact arm 123 that extends downward from the base plate 121; each of the contacts 120 is formed by stamping and forming a metal plate. Here, the base plate 121 is designed such that both left and right side edges thereof are press-fitted into one of the contact accommodating cavities 118 in the housing 110.

The first elastic contact arm 122 is formed in a cantilever shape comprising a base 122a that extends from a central portion in a direction of width of an upper edge of the base plate 121, an arm 122b that extends forward at an inclination toward the top from an upper end of the base 122a with the width thereof being gradually reduced toward a tip end 122d, a contact member 122c that is formed by bending at the tip end of the arm 122b, and the tip end 122d that extends forward at an inclination toward the bottom from the contact member 122c. A pair of cutouts 124 for allowing the first elastic contact arm 122 to flex easily in a vertical direction are formed in either side of the base 122a in the direction of width. Furthermore, in a state in which the base plate 121 is press-fitted into the contact accommodating cavity 118 in the housing 110, the arm 122b, the contact member 122c, and the tip end 122d of the first elastic contact arm 122 are designed to protrude upward from the upper surface of the base 111 of the housing 110. Moreover, when the IC package 130 is accommodated in the package accommodating space 113, a conductive pad (not shown in the figures) provided on an undersurface of the IC package 130 contacts the contact member 122c from above.

In addition, the second elastic contact arm 123 is formed in a shape symmetrical to the first elastic contact arm 122, and is formed in a cantilever shape comprising a base 123a that extends from the central portion in the direction of width of a lower edge of the base plate 121, an arm 123b that extends forward at an inclination toward the bottom from the lower end of the base 123a with the width thereof being gradually reduced toward a tip end 123d, a contact member 123c that is formed by bending at a tip end of the arm 123b, and the tip end 123d that extends forward at an inclination toward the top from the contact member 123c. A pair of cutouts 124 for allowing the second elastic contact arm 123 to flex easily in the vertical direction are formed in either side of the base 123a in the direction of width. Furthermore, in a state in which the base plate 121 is press-fitted into the contact accommodating cavity 118 in the housing 110, the arm 123b, the contact member 123c, and the tip end 123d of the second elastic contact arm 123 are designed to protrude downward from the undersurface of the base 111 of the housing 110. Moreover, when the conventional electrical connector 101 is mounted on the circuit board 140, a conductive pad (not shown in the figures) provided on an upper surface of the circuit board 140 contacts the contact member 123c from below.

Here, when the IC package 130 is accommodated in the package accommodating space 113 from above, sides of the IC package 130 press the elastic arms 114 provided on the side walls 112, and cause the elastic arms 114 to be elastically deformed and move toward the side walls 112, so that the IC package 130 is prevented from slipping out of the package accommodating space 113 by the elastic force of the elastic arms 114. In this case, furthermore, the conductive pads (not shown in the figures) provided on the IC package 130 contact the contact members 122c, and the conductive pads (not shown in the figures) provided on the circuit board 140 contact the contact members 123c; moreover, the conductive pads (not shown in the figures) of the IC package 130 press the contact members 122c, and the conductive pads of the circuit board 140 press the contact members 123c, so that the first elastic contact arms 122 and the second elastic contact arms 123 of the contacts 120 flex, and respectively undergo elastic displacement in the vertical direction so as to approach each other, thus realizing the secure electrical connection between the IC package 130 and the circuit board 140. Furthermore, when the first elastic contact arms 122 and the second elastic contact arms 123 of the contacts 120 flex, and respectively undergo elastic displacement in the vertical direction so as to approach each other, the contact pressure against the contact members 122c and the contact pressure against the contact members 123c are respectively imparted by the elastic forces of the first elastic contact arms 122 and the second elastic contact arms 123, thus obtaining the contact reliability of the contact members 122c and 123c.

Moreover, when the conductive pads (not shown in the figures) provided on the IC package 130 contact and press the contact members 122c, and the conductive pads (not shown in the figures) provided on the circuit board 140 contact and press the contact members 123c, the respective first elastic contact arms 122 and the second elastic contact arms 123 are elastically displaced in the horizontal direction as well, so that the contact members 122c and the contact members 123c horizontally move toward the adjacent contacts 120. In this case, between two of the contact accommodating cavities 118, a first projection 115 is disposed on the upper side, and a second projection 116 is disposed on the lower side; accordingly, when the contact members 122c and the contact members 123c reach certain positions, the free ends of the first elastic contact arms 122 contact the side surfaces of the first projections 115, and the free ends of the second elastic contact arms 123 contact the side surfaces of the second projections 116, so that it is possible to prevent the plastic deformation of the first elastic contact arms 122 and the second elastic contact arms 123 caused by the application of an excessive force.

However, the following problems have been encountered in the conventional electrical connector 101. Specifically, there are cases in which the IC package 130 or the circuit board 140 is warped or deformed for some reason. In such cases, when the conductive pads (not shown in the figures) provided on the IC package 130 contact and press the contact members 122c, and the conductive pads (not shown in the figures) provided on the circuit board 140 contact and press the contact members 123c, it is not possible to obtain a desired amount of flexing of the first elastic contact arms 122 and the second elastic contact arms 123 of the contacts 120 in the vertical direction. As a result, a desired elastic force of the first elastic contact arms 122 and the second elastic contact arms 123 cannot be obtained, which makes it impossible to give the appropriate contact pressure against the contact members 122c and the appropriate contact pressure against the contact members 123c, so that the contact reliability of the contact members 122c and 123c may be insufficient.

SUMMARY

Accordingly, the present invention was devised in light of these problems; it is an object of the present invention to provide contacts and an electrical connector which can increase the contact reliability of contact members on first elastic contact arms that contact conductive pads on an IC package and contact members of second elastic contact arms that contact conductive pads on a circuit board.

This and other objects are achieved by a contact comprising a substantially rectangular base plate. A linking member extends from the base plate such that the linking member is perpendicular thereto. A first elastic contact arm extends obliquely upward from a tip end of the linking member. The first elastic contact arm has a contact member for electrically connecting the first elastic contact arm to an integrated circuit socket. A second elastic contact arm extends obliquely downward from a tip end of the linking member. The second elastic contact arm has a contact member for electrically connecting the second elastic contact arm to a circuit board.

This and other objects are further achieved by an electrical connector comprising an insulating housing and first and second contacts. The insulating housing has a base with an opening formed in a central portion thereof. The base is provided with at least one row of first contact accommodating cavities and at least one row of second contact accommodating cavities. Each of the first and second contact accommodating cavities has a base plate accommodating part. The base plate accommodating parts of the first and second contact accommodating cavities of adjacent rows of the first and second contact accommodating cavities are arranged in a single line. The first and second contacts each have a substantially rectangular base plate. A linking member extends from the base plate such that the linking member is perpendicular thereto. A first elastic contact arm extends obliquely upward from a tip end of the linking member and has a contact member for electrically connecting the first elastic contact arm to an integrated circuit socket. A second elastic contact arm extends obliquely downward from a tip end of the linking member and has a contact member for electrically connecting the second elastic contact arm to a circuit board. The first contacts are disposed in the first contact accommodating cavities such that the base plate of the first contacts are disposed in the base plate accommodating part of the first contact accommodating cavities. The second contacts are disposed in the second contact accommodating cavities such that the base plate of the second contacts are disposed in the base plate accommodating part of the second contact accommodating cavities.

BRIEF DESCRIPTION OF THE DRAWINGS

FIG. 3 is a bottom view of the electrical connector of FIG. 1;

FIG. 13 is a perspective view used to illustrate a method for attaching a jig to a circuit board;

DETAILED DESCRIPTION OF THE EMBODIMENT(S)

Figure 1:
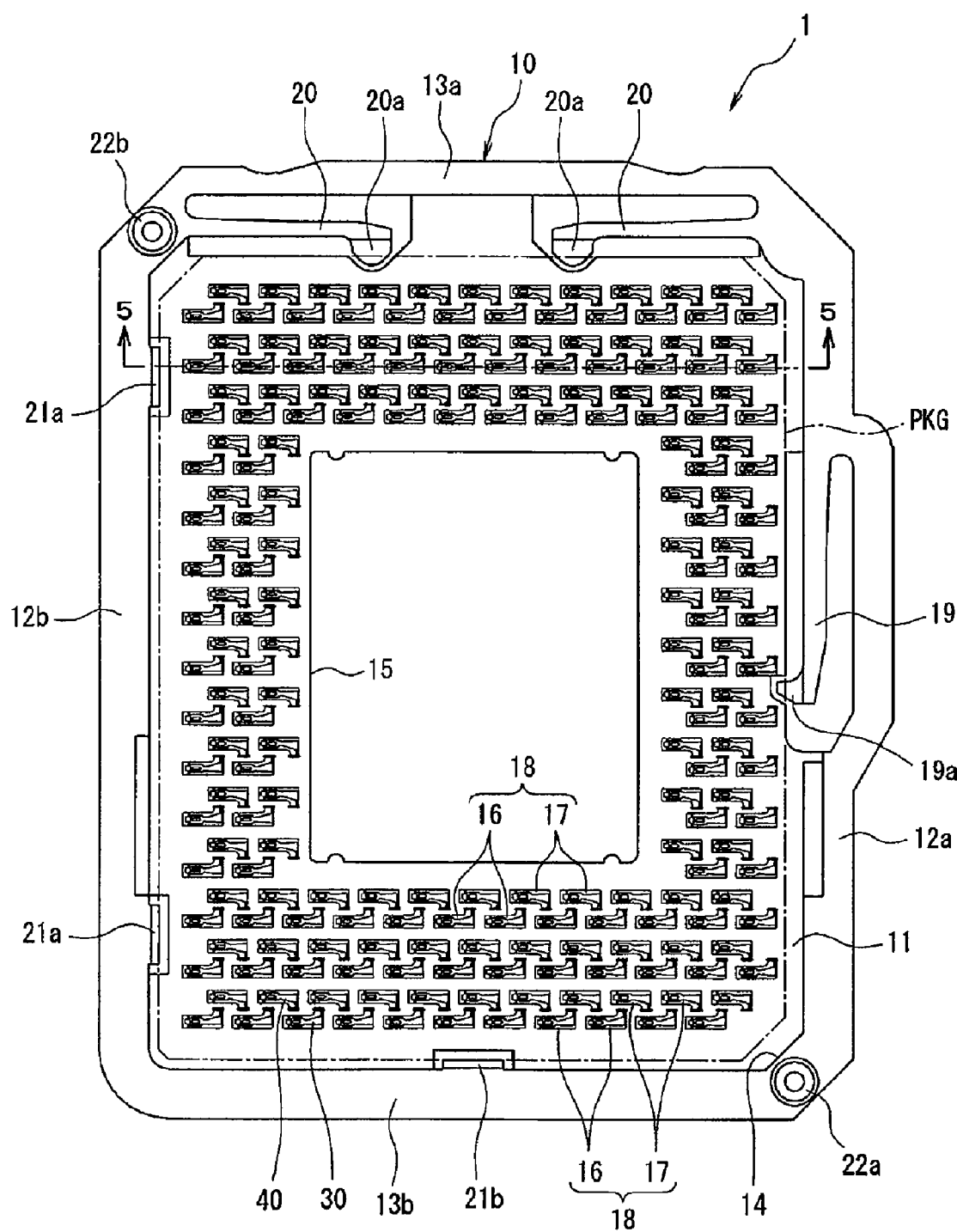
FIG. 1 is a plan view of an electrical connector of the present invention.
Figure 2:
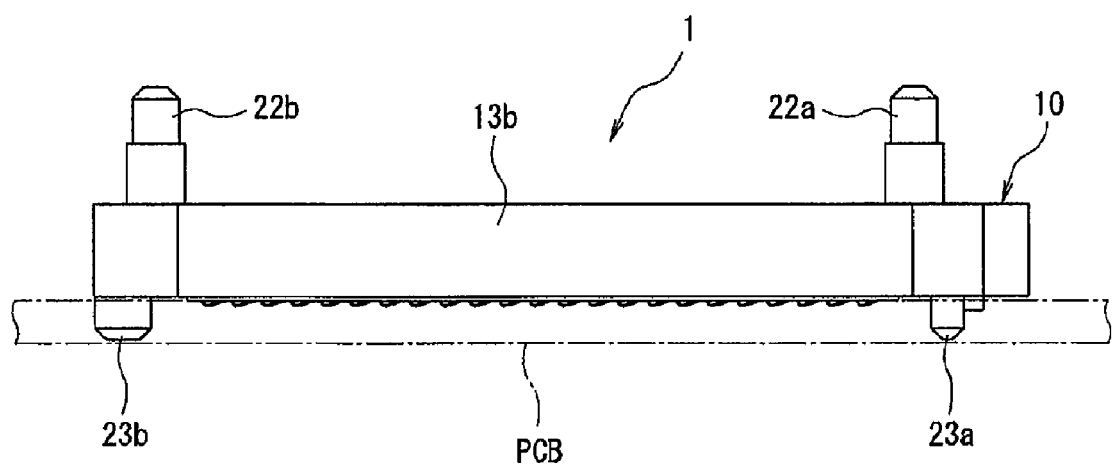
FIG. 2 is a front view of the electrical connector of FIG. 1.

Next, an embodiment of the present invention will be described with reference to the figures. In FIGS. 1 through 3, an electrical connector 1 comprises an insulating housing 10, and a plurality of first contacts 30 and a plurality of second contacts 40 that are secured to the housing 10.

Figure 4:
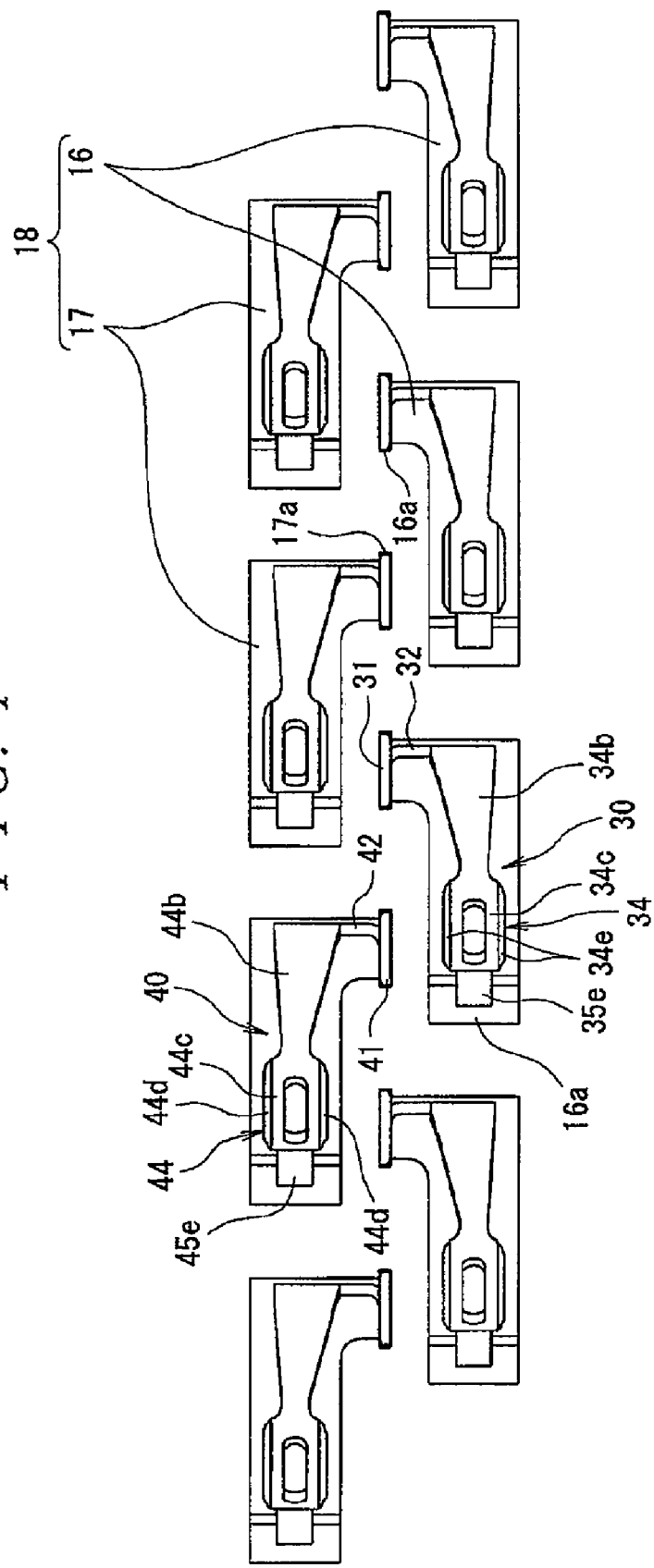
FIG. 4 is a plan view showing a portion of a contact accommodating cavity row in FIG. 1.
Figure 6:
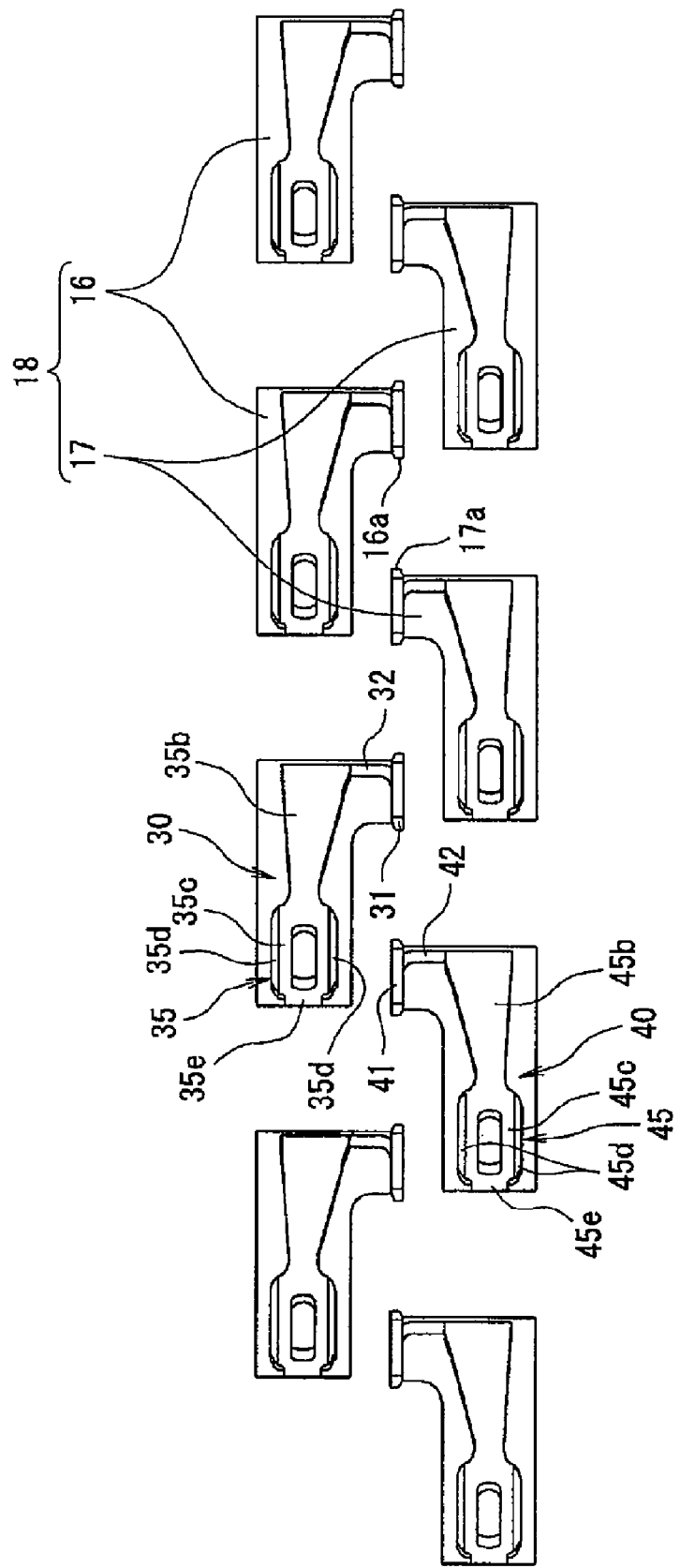
FIG. 6 is a bottom view showing a portion of a contact accommodating cavity row in FIG. 3.

Here, the housing 10 comprises a base 11 that is formed in a substantially rectangular plate form, two side walls 12a and 12b that rise from both left and right edges of the base 11 in a direction of width (left-right direction in FIG. 1), and end walls 13a and 13b that rise from both front and rear edges of the base 11 in a direction of length (vertical direction in FIG. 1); the housing 10 is formed by molding an insulating resin. A rectangular opening 15 is formed in a central portion of the base 11, and a plurality of contact accommodating cavity rows 18 are formed so as to surround the opening 15. As is shown in FIGS. 1 and 3, each of the contact accommodating cavity rows 18 is constructed from a plurality of first contact accommodating cavities 16 and a plurality of second contact accommodating cavities 17 that are disposed in a staggered arrangement along the direction of width of the base 11, and the contact accommodating cavity rows 18 are formed along the direction of length of the base 11. Each of the first contact accommodating cavities 16 is designed to accommodate at least one of the first contacts 30, and each of the second contact accommodating cavities 17 is designed to accommodate at least one of the second contacts 40. Here, the first contact accommodating cavities 16 are disposed on a front side in the direction of length as seen in plan view (i.e., on the lower side in FIG. 1 and on the upper side in FIG. 3), and the second contact accommodating cavities 17 are disposed on a rear side in the direction of length as seen in plan view. Furthermore, as is shown in FIGS. 4 and 6, the first contact accommodating cavities 16 and the second contact accommodating cavities 17 are disposed such that base plate accommodating parts 16a of the first contact accommodating cavities 16 and base plate accommodating parts 17a of the second contact accommodating cavities 17 are respectively aligned in a straight line in the direction of width of the base 11. Moreover, the space surrounded by the side walls 12a and 12b, the end walls 13a and 13b, and the base 11 forms a package accommodating space 14 that accommodates an IC package PKG.

In addition, one first elastic arm 19 is provided on the side wall 12a located on the right side (right side in FIG. 1) in the direction of width as seen in plan view, and two second elastic arms 20 are provided on the rear side (upper side in FIG. 1) in the direction of length as seen in plan view. A projection 19a that contacts a side edge of the IC package PKG accommodated in the package accommodating space 14 and that pushes the IC package PKG toward the side wall 12b located on an opposite side of the side wall 12a on which the first elastic arm 19 is provided is disposed at a tip end of the first elastic arm 19. Furthermore, a projection 20a that contacts an end edge of the IC package PKG accommodated in the package accommodating space 14 and that pushes the IC package PKG toward the end wall 13b located on the opposite side of the end wall 13a on which the second elastic arms 20 are provided is disposed at a tip end of each of the second elastic arms 20.

Moreover, two locking members 21a that are locked on the upper surface of the IC package PKG accommodated in the package accommodating space 14 and that restrict the IC package PKG from flying out are provided on the side wall 12b located on the opposite side of the side wall 12a on which the first elastic arm 19 is provided. In addition, as is shown in FIG. 1, a first positioning post 22a is provided on the upper surface in the area where the side wall 12a on which the first elastic arm 19 is provided intersects with the end wall 13b, and a second positioning post 22b is provided on the upper surface in the area where the side wall 12b located on the opposite side of the side wall 12a intersects with the end wall 13a located on the opposite side of the end wall 13b. Furthermore, as is shown in FIGS. 2 and 3, a third positioning post 23a is provided on the undersurface of the base 11 in the area substantially corresponding to the first positioning post 22a, and a fourth positioning post 23b is provided on the undersurface of the base 11 in the area substantially corresponding to the second positioning post 22b.

Figure 5:
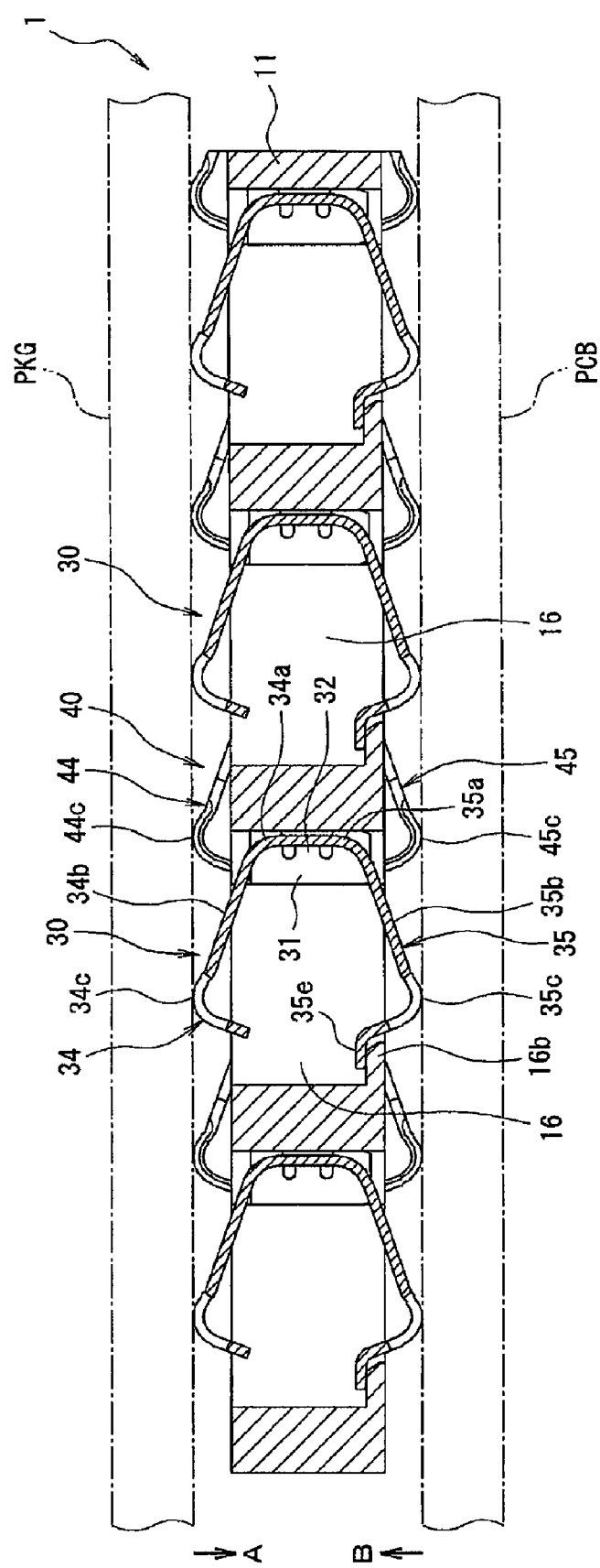
FIG. 5 is a sectional view along line 5-5 in FIG. 1.
Figure 7A:
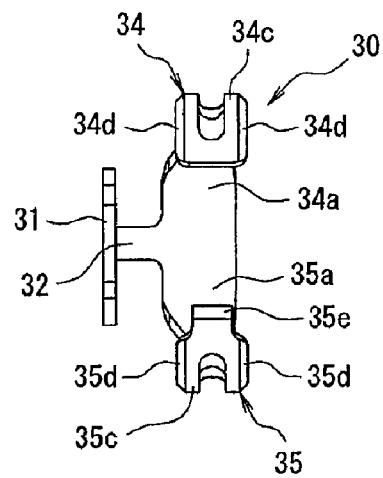
FIGS. 7A, 7B, 7C, 7D, 7E, and 7F show a first contact, with FIG. 7A being a front view, FIG. 7B being a right side view, FIG. 7C being a left side view, FIG. 7D being a back view, FIG. 7E being a plan view, and FIG. 7F being a bottom view.
Figure 7B:
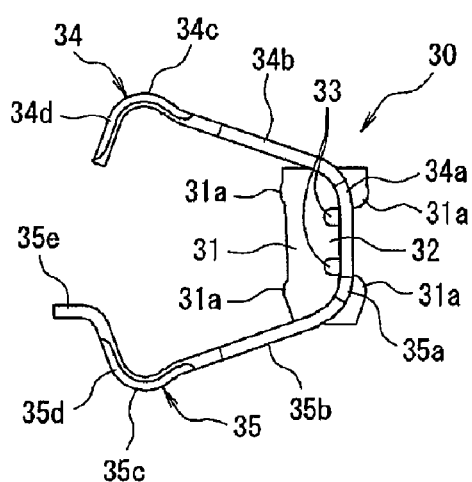
Figure 7C:
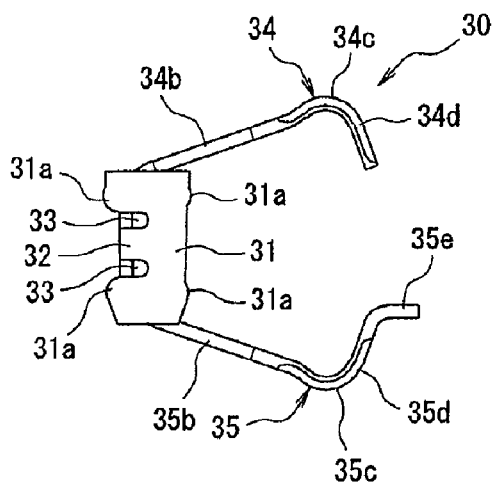
Figure 7D:
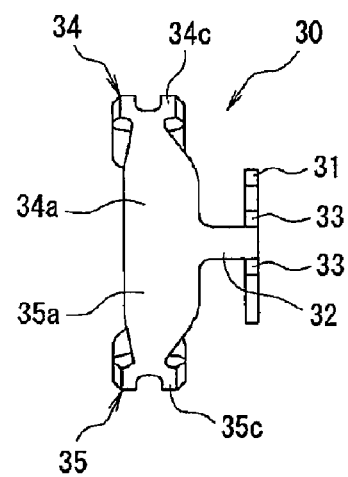
Figure 7E:
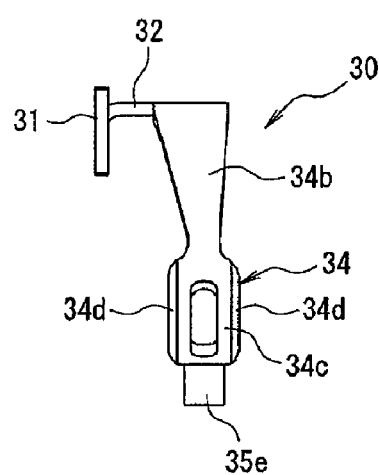
Figure 7F:
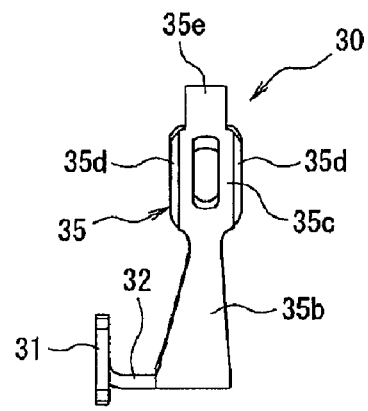

Each of the first contacts 30 is formed by stamping and forming a metal plate, and comprises a substantially rectangular base plate 31 that extends in the vertical direction as shown in FIGS. 7A, 7B, 7C, 7D, and 7E. A plurality of press-fitting members 31a are formed so as to protrude from each of two side edges of the base plate 31 in the direction of width (in the direction of width of the base 11, i.e., in the same direction as the left-right direction in FIG. 1) as shown in FIGS. 7B and 7C. The base plate 31 is designed to be inserted into the first contact accommodating cavity 16 (i.e., the base plate accommodating part 16a of the first contact accommodating cavity 16 described above) from above the housing 10, and to be press-fitted by the press-fitting members 31a. Furthermore, as is shown in FIGS. 7B and 7C, a pair of cutouts 33 and 33 are formed in the right side edge of the base plate 31 in the direction of width, separated by a specified distance in the vertical direction, and as is shown in FIGS. 7A, 7D, 7E, and 7F, the portion between the cutouts 33 and 33 is bent so as to extend in the forward direction that is perpendicular to the main surface of the base plate 31 (forward in the direction of length of the base 11, i.e., in the downward direction in FIG. 1); this portion constitutes a linking member 32. The position of the linking member 32 in the vertical direction is substantially the center of the base plate 31 in the vertical direction. Moreover, the width of the linking member 32 is considerably smaller than the width of the base plate 31 in the vertical direction. In addition, as is shown in FIG. 7B, a first elastic contact arm 34 that extends obliquely upward and leftward (toward the left of the base plate 31 in the direction of width) from a tip end of the linking member 32, and a second elastic contact arm 35 that extends obliquely downward and leftward (toward the left of the base plate 31 in the direction of width) from the tip end are provided at the tip end. The first elastic contact arm 34 comprises a base 34a that extends upward from the tip end of the linking member 32 with the width being greater than the linking member 32, an elastic arm 34b that is bent from the base 34a and that extends obliquely upward and leftward, and a contact member 34c that is curved at a tip end of the elastic arm 34b in an upward convex shape. As is shown in FIG. 5, in a state in which the base plate 31 is press-fitted into the first contact accommodating cavity 16, the contact member 34c protrudes upward beyond the upper surface of the base 11 of the housing 10, so that a conductive pad (not shown in the figures) of the IC package PKG contacts the contact member 34c. In addition, bevels 34d are applied to corner portions of both side surfaces of the contact member 34c. Meanwhile, the second elastic contact arm 35 comprises a base 35a that extends downward from the tip end of the linking member 32 with the width being greater than the linking member 32, an elastic arm 35b that is bent from the base 35a and that extends obliquely downward and leftward, a contact member 35c that is curved at a tip end of the elastic arm 35b in a downward convex shape, and an anti-slipping piece 35e that extends in the leftward direction from the tip end of the contact member 35c. As is shown in FIG. 5, in a state in which the base plate 31 is press-fitted into the first contact accommodating cavity 16, the contact member 35c protrudes downward beyond the undersurface of the base 11 of the housing 10, so that a conductive pad (not shown in the figures) of a circuit board PCB contacts the contact member 35c. Furthermore, as is shown in FIG. 7F, bevels 35d are applied to corner portions of both side surfaces of the contact member 35c. Moreover, as is shown in FIG. 5, in a state in which the first contacts 30 are respectively accommodated inside the first contact accommodating cavities 16, the anti-slipping pieces 35e respectively contact projections 16b provided on the base 11 of the housing 10, so that the tip ends of the contact members 35c are prevented from slipping out of the first contact accommodating cavities 16.

Figure 9A:
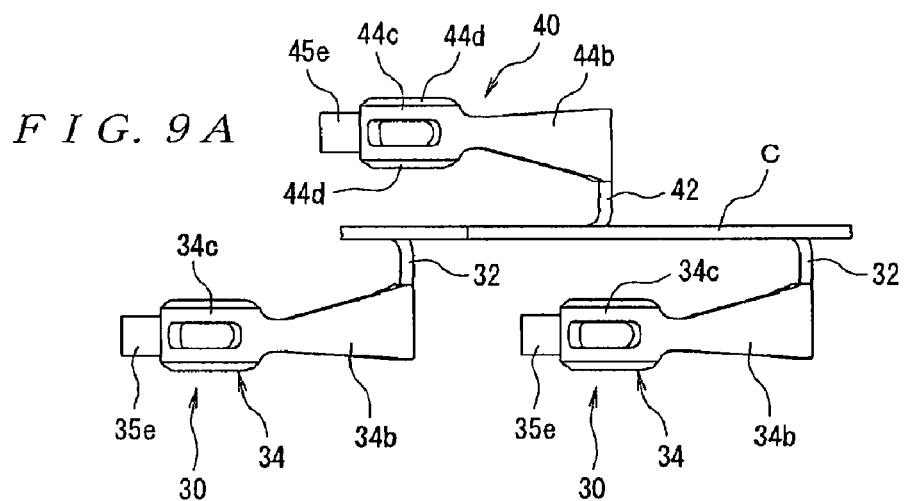
FIGS. 9A and 9B show a state in which the first contacts and second contacts are attached to a carrier, with FIG. 9A being a plan view of the first contacts and the second contacts, and FIG. 9B being a side view of the first contacts and the second contacts.
Figure 9B:
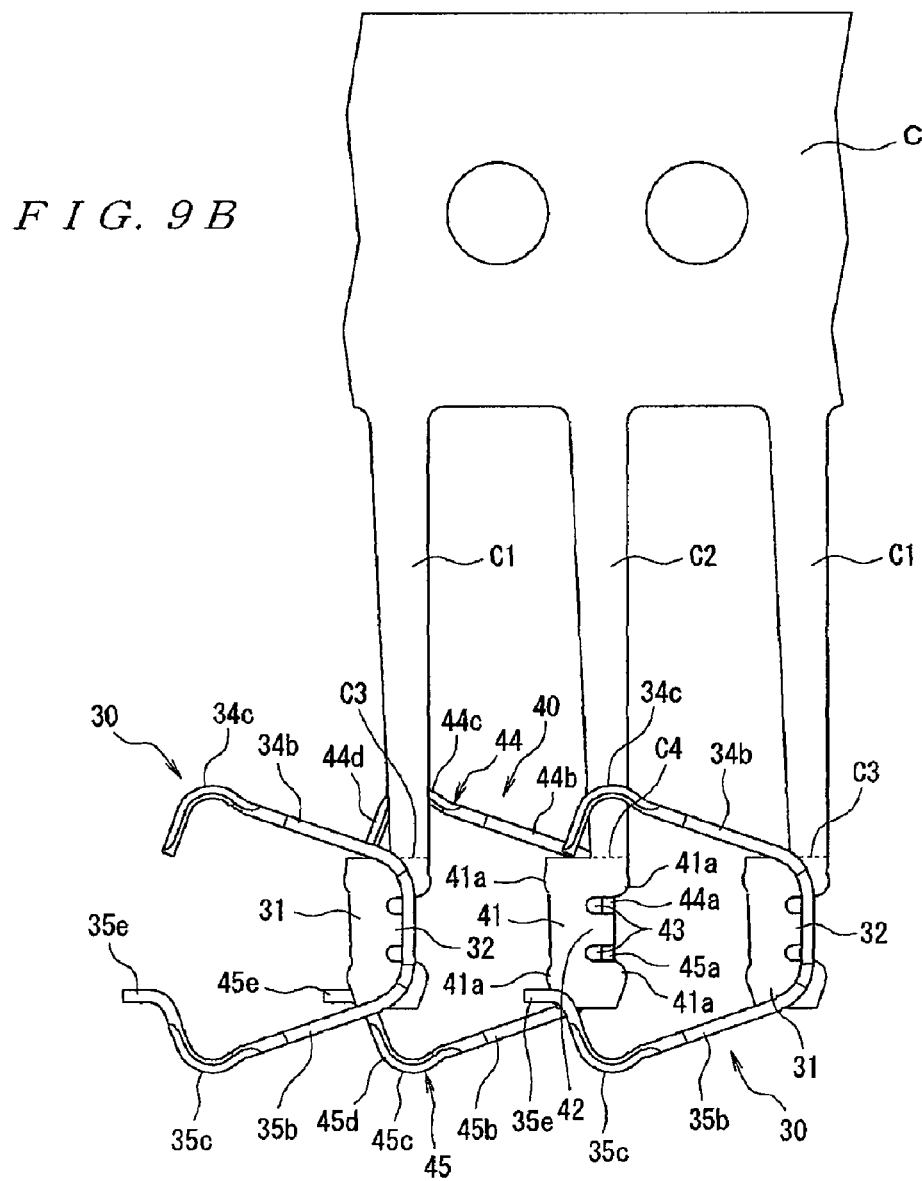

Meanwhile, each of the second contacts 40 is formed by stamping and forming a metal plate, and comprises a substantially rectangular base plate 41 that extends in the vertical direction as shown in FIGS. 4, 6, 9A and 9B. A plurality of press-fitting members 41a are formed so as to protrude from each of two side edges of the base plate 41 in the direction of width (in the direction of width of the base 11, i.e., in the same direction as the left-right direction in FIG. 1) as shown in FIG. 9B. The base plate 41 is designed to be inserted into the base plate accommodating part 17a of the second contact accommodating cavity 17 from above the housing 10, and to be press-fitted by the press-fitting members 41a. Furthermore, as is shown in FIG. 9B, a pair of cutouts 43 and 43 are formed in the right side edge of the base plate 41 in the direction of width, separated by a specified distance in the vertical direction, and as is shown in FIGS. 4 and 9A, the portion between the cutouts 43 and 43 is bent so as to extend in the rearward direction that is perpendicular to the main surface of the base plate 41 (opposite direction of the linking member 32 and rearward in the direction of length of the base 11, i.e., in the upward direction in FIG. 1); this portion constitutes a linking member 42. The position of the linking member 42 in the vertical direction is substantially the center of the base plate 41 in the vertical direction. Moreover, the width of the linking member 42 is considerably smaller than the width of the base plate 41 in the vertical direction. In addition, as is shown in FIG. 9B, a first elastic contact arm 44 that extends obliquely upward and leftward from a tip end of the linking member 42, and a second elastic contact arm 45 that extends obliquely downward and leftward from the tip end are provided at the tip end. The first elastic contact arm 44 comprises a base 44a that extends upward from the tip end of the linking member 42 with the width being greater than the linking member 42, an elastic arm 44b that is bent from the base 44a and that extends obliquely upward and leftward, and a contact member 44c that is curved at a tip end of the elastic arm 44b in an upward convex shape. As is shown in FIG. 5, in a state in which the base plate 41 is press-fitted into the second contact accommodating cavity 17, the contact member 44c protrudes upward beyond the upper surface of the base 11 of the housing 10, so that a conductive pad (not shown in the figures) of the IC package PKG contacts the contact member 44c. In addition, bevels 44d are applied to corner portions of both side surfaces of the contact member 44c. Meanwhile, the second elastic contact arm 45 comprises a base 45a that extends downward from the tip end of the linking member 42 with the width being greater than the linking member 42, an elastic arm 45b that is bent from the base 45a and that extends obliquely downward and leftward, a contact member 45c that is curved at tip end of the elastic arm 45b in a downward convex shape, and an anti-slipping piece 45e that extends in the leftward direction from the tip end of the contact member 45c. As is shown in FIG. 5, in a state in which the base plate 41 is press-fitted into the second contact accommodating cavity 17, the contact member 45c protrudes downward beyond the undersurface of the base 11 of the housing 10, so that a conductive pad (not shown in the figures) of the circuit board PCB contacts the contact member 45c. Furthermore, as is shown in FIG. 6, bevels 45d are applied to corner portions of both side surfaces of the contact member 45c. Moreover, in a state in which the second contacts 40 are respectively accommodated inside the second contact accommodating cavities 17, the anti-slipping pieces 45e respectively contact projections (not shown in the figures) provided on the base 11 of the housing 10, so that the tip ends of the contact members 45c are prevented from slipping out of the second contact accommodating cavities 17.

Next, a method for manufacturing the electrical connector 1 will be described with reference to FIGS. 1, 4, 5, 9A, and 9B. First, the housing 10 shown in FIG. 1 is prepared. Next, as is shown in FIGS. 9A and 9B, carriers C are prepared for the number of the contact accommodating cavity rows 18, with each of the carriers C being a carrier C to which the first contacts 30 of equal number to the first contact accommodating cavities 16 in each of the contact accommodating cavity rows 18 are linked by contact linking pieces C1 at the same pitch as the first contact accommodating cavities 16, and to which the second contacts 40 of equal number to the second contact accommodating cavities 17 in the same contact accommodating cavity row 18 are linked by contact linking pieces C2 at the same pitch as the second contact accommodating cavities 17. These are manufactured by stamping and forming metal plates. In this state, the upper edges of the base plates 31 of the first contacts 30 are respectively linked to the contact linking pieces C1, while the upper edges of the base plates 41 of the second contacts 40 are respectively linked to the contact linking pieces C2, and the linking members 32 of the first contacts 30 and the linking members 42 of the second contacts 40 extend in opposite directions relative to each other from the base plates 31 and 41, respectively. Therefore, as is shown in FIG. 9A, a state is created in which the first elastic contact arms 34 and the second elastic contact arms 35 of the first contacts 30 and the first elastic contact arms 44 and the second elastic contact arms 45 of the second contacts 40 are arranged in a staggered fashion with respect to the corresponding carrier C as seen in plan view.

Then, in a state in which the first contacts 30 and the second contacts 40 are linked to the carrier C, the base plates 31 of the first contacts 30 and the base plates 41 of the second contacts 40 are respectively inserted and press-fitted into the base plate accommodating parts 16a of the first contact accommodating cavities 16 and the base plate accommodating parts 17a of the second contact accommodating cavities 17 all at once from above the housing 10, as shown in FIGS. 4 and 5. That is, the press-fitting work of the first and second contacts 30 and 40 is performed once for each of the contact accommodating cavity rows 18. Next, the linking pieces C1 of the carrier C and the base plates 31 of the first contacts 30 are cut off at cut lines C3 shown in FIG. 9B, and the linking pieces C2 of the carrier C and the base plates 41 of the second contacts 40 are cut off at cut lines C4. Such a press-fitting and cutting work is performed for the number of times corresponding to the number of the contact accommodating cavity rows 18. As a result, the electrical connector 1 is completed.

Another conceivable method will be described below and compared with the invention of the present application.

Here, unlike a case in which the first contacts 30 and the second contacts 40 are used, and the first contacts 30 and the second contacts 40 are arranged in a staggered fashion, a case in which only the first contacts 30 are used, and the first contacts 30 are arranged in a staggered fashion will be described with reference to FIGS. 10A, 10B, and 11.

Figure 11:
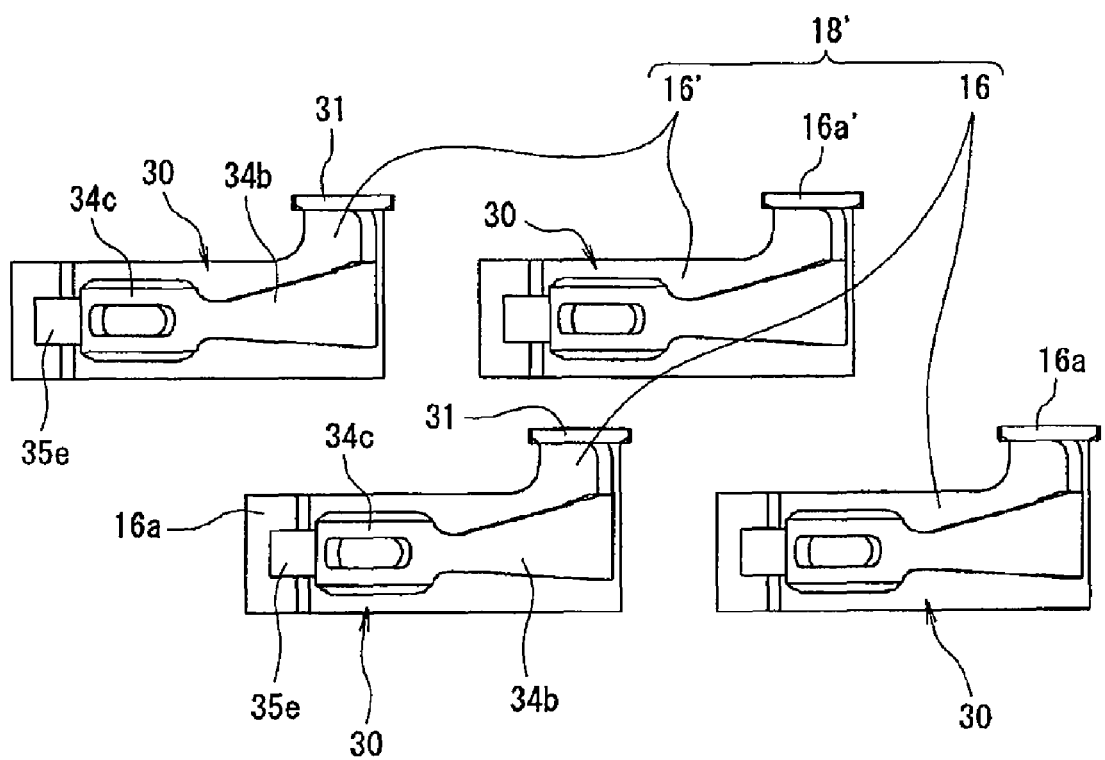
FIG. 11 is a plan view showing a portion of the contact accommodating cavity row in a case in which the first contacts are arranged in a staggered fashion using only the first contacts shown in FIGS. 10A and 10B.

In this case, first, as is shown in FIG. 11, the housing 10 is prepared which has a plurality of contact accommodating cavity rows 18' in which the first contact accommodating cavities 16 and a plurality of other first contact accommodating cavities 16' are disposed in a staggered arrangement such that the base plate accommodating parts 16a of the first contact accommodating cavities 16 and base plate accommodating parts 16a' of the other first contact accommodating cavities 16' are arranged in a staggered fashion.

Figure 10A:
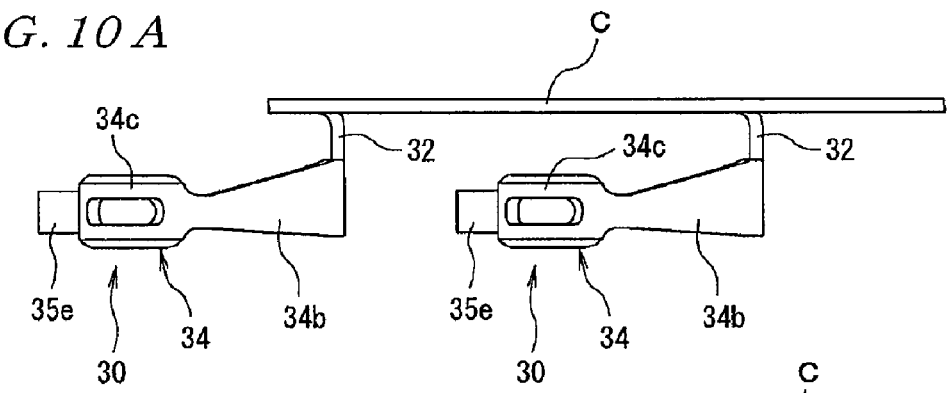
FIGS. 10A and 10B show a state in which the first contacts are attached to a carrier in a case in which the first contacts are arranged in a staggered fashion using only the first contacts, with FIG. 10A being a plan view of the first contacts, and FIG. 10B being a side view of the first contacts.
Figure 10B:
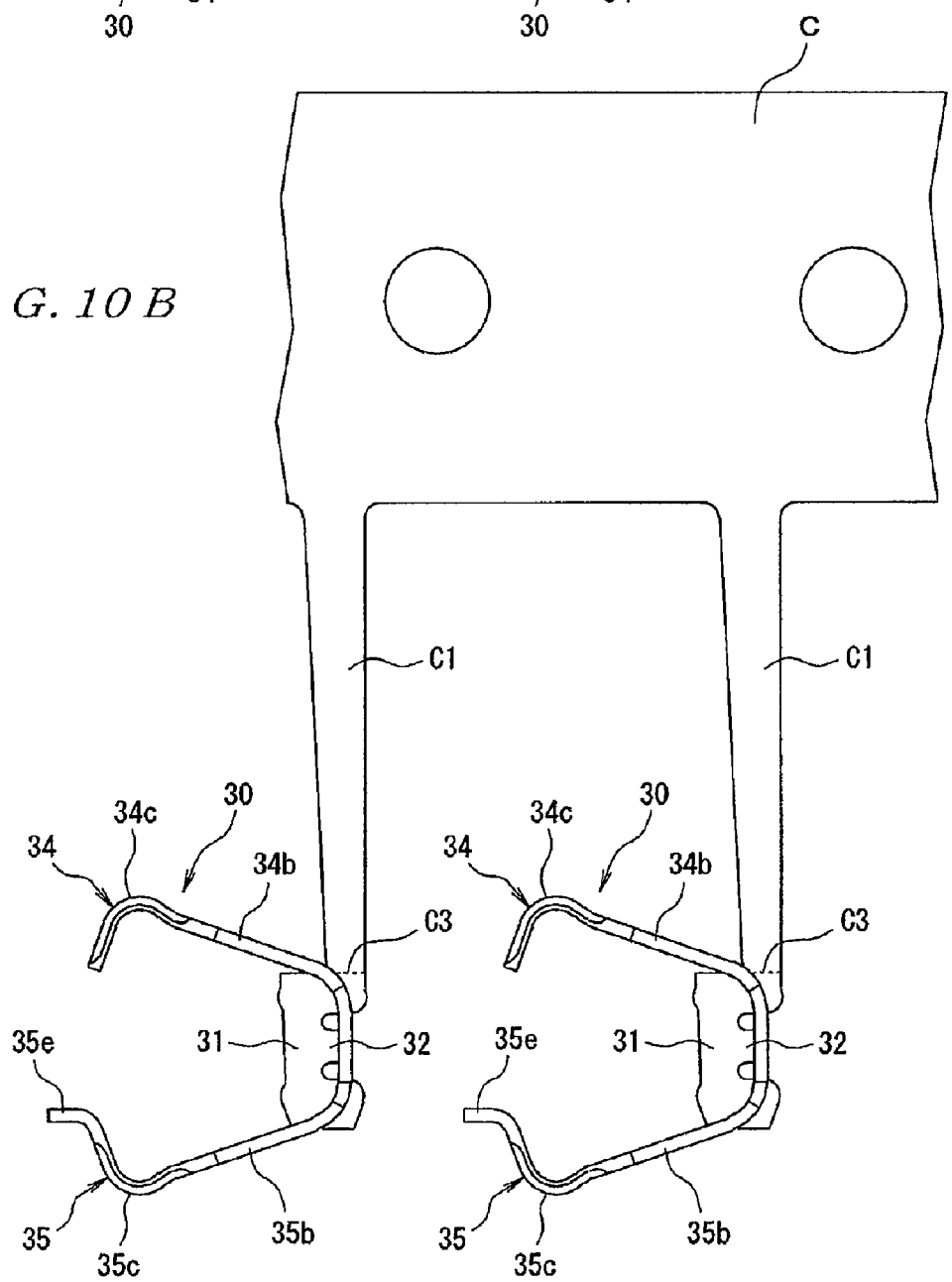

Next, as is shown in FIGS. 10A and 10B, carriers C are prepared for two times the number of the contact accommodating cavity rows 18', with each of the carriers C being the carrier C to which the first contacts 30 of equal number to the first contact accommodating cavities 16 in each of the contact accommodating cavity rows 18' are linked by contact linking pieces C1 at the same pitch as the first contact accommodating cavities 16. These are manufactured by stamping and forming metal plates. In this state, as is shown in FIG. 10A, the first elastic contact arms 34 of the first contacts 30 are arranged on one side of the corresponding carrier C as seen in plan view.

Then, in a state in which the first contacts 30 are linked to the corresponding carriers C, the base plates 31 of the first contacts 30 are respectively inserted and press-fitted into the base plate accommodating parts 16a of the first contact accommodating cavities 16, as shown in FIG. 11. Next, the linking pieces C1 of the carriers C and the base plates 31 of the first contacts 30 are cut off at cut lines C3 shown in FIG. 10B.

Furthermore, the base plates 31 of the first contacts 30 that are linked to the corresponding carriers C are similarly respectively inserted and press-fitted into the base plate accommodating parts 16a' of the other first contact accommodating cavities 16'. Next, the linking pieces C1 of the carriers C and the base plates 31 of the first contacts 30 are cut off at the cut lines C3. That is, the press-fitting work of the first contacts 30 is performed twice for each of the contact accommodating cavity rows 18'.

Then, such a work of press-fitting and cutting the base plates 31 of the first contacts 30 is performed for the number of times corresponding to the number of the contact accommodating cavity rows 18'.

Thus, in a case in which only the first contacts 30 are used, and the first contacts 30 are arranged in a staggered fashion, the press-fitting work of the first contacts 30 is performed twice for each of the contact accommodating cavity rows 18', whereas in a case in which the first contacts 30 and the second contacts 40 are used, and the first contacts 30 and the second contacts 40 are arranged in a staggered fashion, the press-fitting work of the first and second contacts 30 and 40 is performed only once for each of the contact accommodating cavity rows 18. Accordingly, in a case in which the first contacts 30 and the second contacts 40 are used, and the first contacts 30 and the second contacts 40 are arranged in a staggered fashion, as in the present embodiment, there is the merit of facilitating and simplifying the press-fitting work of the first and second contacts 30 and 40.

Moreover, in the case of the present embodiment, the linking members 32 of the first contacts 30 and the linking members 42 of the second contacts 40 extend in opposite directions relative to each other from the base plates 31 and 41, respectively. Therefore, the first elastic contact arms 34 and the second elastic contact arms 35 of the first contacts 30 and the first elastic contact arms 44 and the second elastic contact arms 45 of the second contacts 40 can be arranged in a staggered fashion with respect to the corresponding carrier C, so that the material for the first contacts 30 and the second contacts 40 can be obtained in a favorable manner.

Next, a method for electrically connecting the IC package PKG and the circuit board PCB to each other by means of the electrical connector 1 will be described. First, as is shown in FIGS. 1 and 5, the IC package PKG is accommodated in the package accommodating space 14 of the electrical connector 1 in the direction of arrow A from the upper side of the electrical connector 1. In this case, the projection 19a of the first elastic arm 19 contacts a side edge of the IC package PKG, and pushes the IC package PKG toward the side wall 12b located on the opposite side of the side wall 12a on which the first elastic arm 19 is provided; furthermore, the projections 20a of the second elastic arms 20 contact an end edge of the IC package PKG, and push the IC package PKG toward the end wall 13b located on the opposite side of the end wall 13a on which the second elastic arms 20 are provided. Then, the locking members 21a provided on the side wall 12b are locked on the upper surface of the IC package PKG, and restrict the IC package PKG from flying out.

Figure 8:
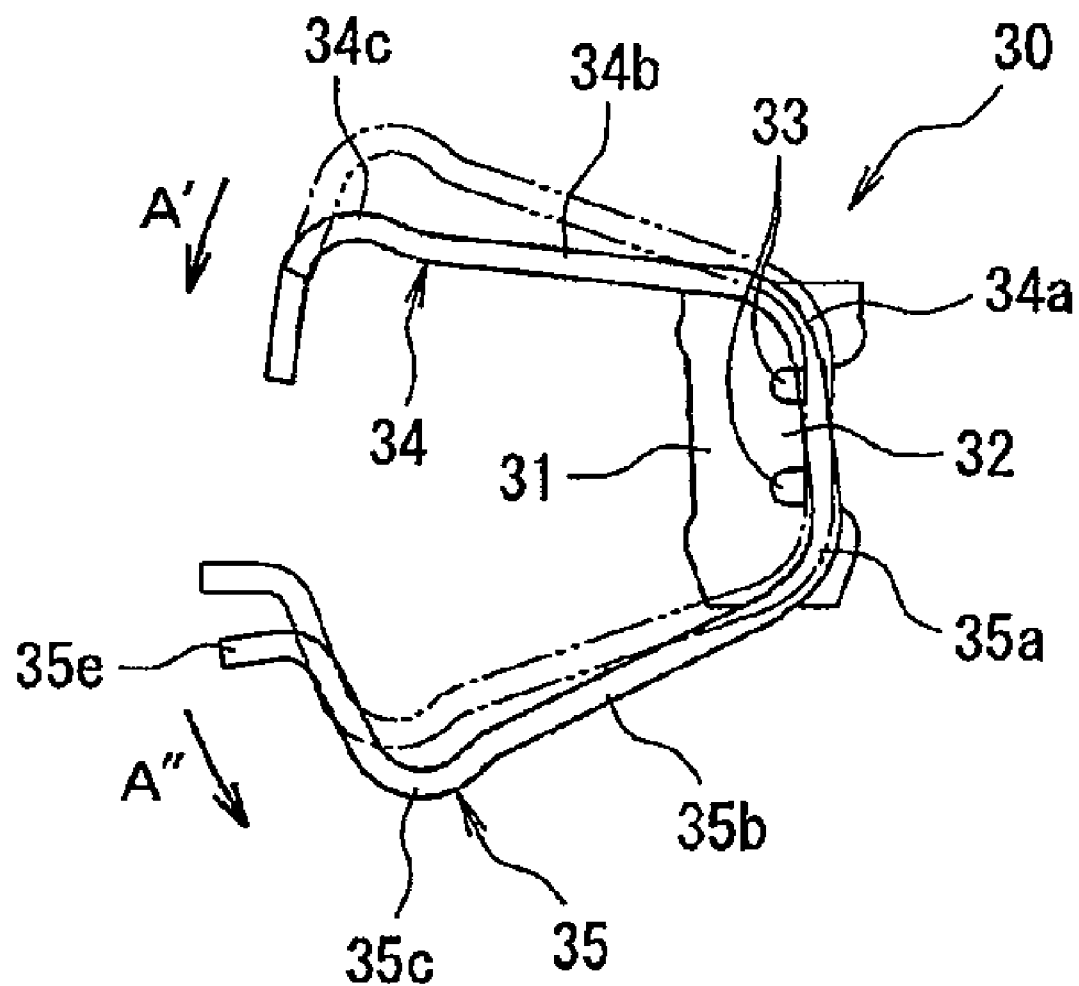
FIG. 8 is an explanatory diagram showing the movement of a first elastic contact arm and a second elastic contact arm in a case in which an external force is applied to the first elastic contact arm of the first contact.

Moreover, when the IC package PKG is accommodated in the package accommodating space 14 of the electrical connector 1 in the direction of arrow A from the upper side of the electrical connector 1, the conductive pads (not shown in the figures) provided on the IC package PKG come into contact with the contact members 34c of the first elastic contact arms 34 of the first contacts 30 and the contact members 44c of the first elastic contact arms 44 of the second contacts 40, and the conductive pads (not shown in the figures) press the contact members 34c and the contact members 44c. Therefore, as is shown in FIG. 8 (only the first contact 30 is shown in FIG. 8), the first elastic contact arms 34 of the first contacts 30 and the first elastic contact arms 44 of the second contacts 40 are elastically deformed downward (in the direction of arrow A' in FIG. 8), so that the contact members 34c of the first elastic contact arms 34 of the first contacts 30 and the contact members 44c of the first elastic contact arms 44 of the second contacts 40 are displaced downward. In FIG. 8, the manner in which the contact members 34c are displaced downward is indicated by a solid line moved from a phantom line. When the contact members 34c and the contact members 44c are displaced downward, the linking members 32 that are linked to the first elastic contact arms 34 and the second elastic contact arms 35 of the first contacts 30 and the linking members 42 that are linked to the first elastic contact arms 44 and the second elastic contact arms 45 of the second contacts 40 respectively undergo elastic deformation with forces smaller than the pressing forces applied to the contact members 34c and the contact members 44c, so that the pressing forces applied to the contact members 34c of the first elastic contact arms 34 and the contact members 44c of the first elastic contact arms 44 on one side are respectively transmitted to the contact members 35c of the second elastic contact arms 35 and the contact members 45c of the second elastic contact arms 45 on the other side. The pressing forces transmitted to the contact members 35c and 45c are approximately ½ to ⅗ of the pressing forces given to the contact members 34c and 44c. As a result, the contact members 35c of the second elastic contact arms 35 of the first contacts 30 and the contact members 45c of the second elastic contact arms 45 of the second contacts 40 are displaced downward (in the direction of arrow A" in FIG. 8).

Figure 12:
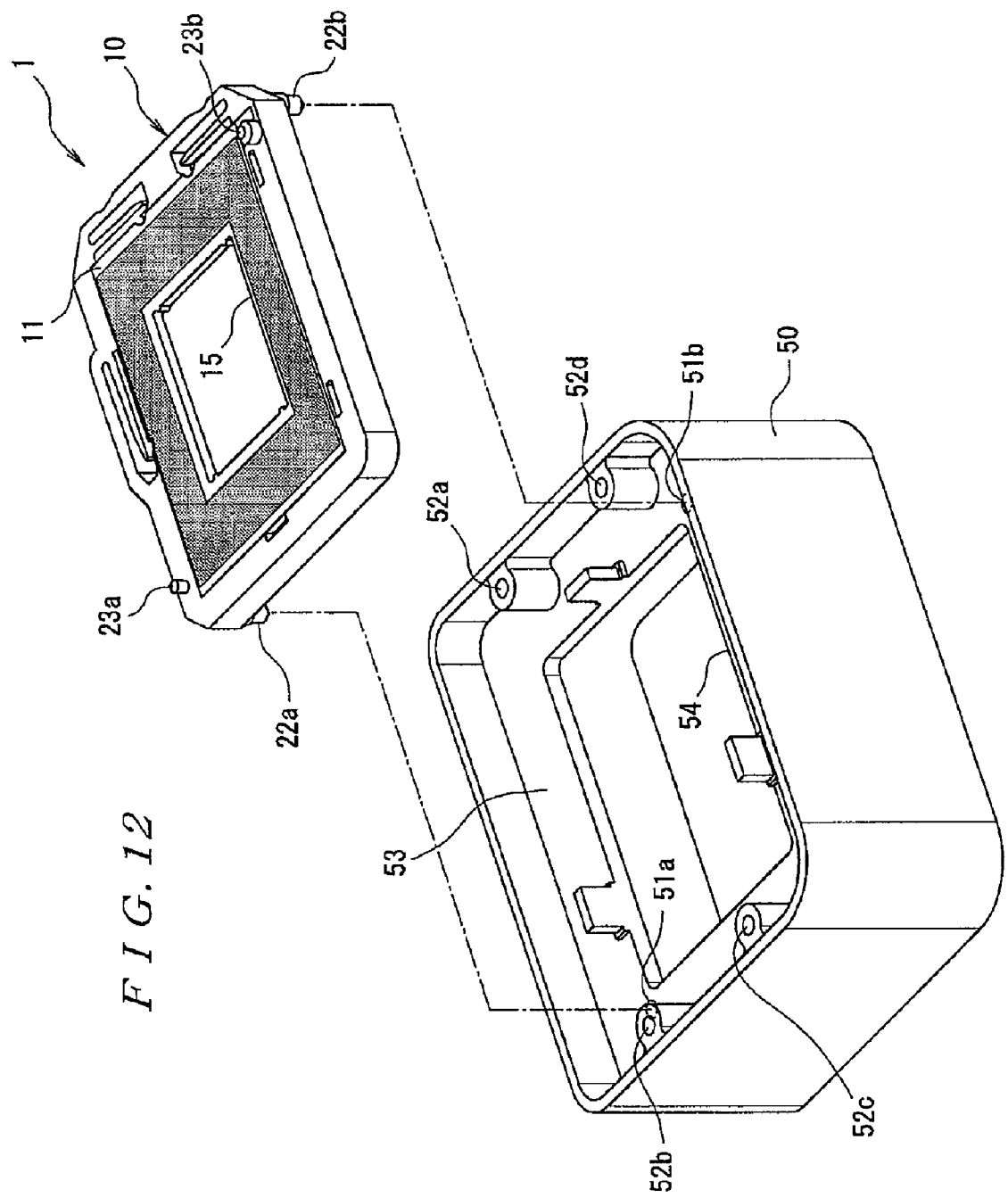
FIG. 12 is a perspective view used to illustrate a method for mounting the electrical connector accommodating an IC package in an engine housing of an optical engine.

Then, the electrical connector 1 accommodating the IC package PKG is mounted in an engine housing 50 of an optical engine (not shown in the figures) as shown in FIG. 12.

The engine housing 50 is formed in a substantially rectangular shape, and a connector accommodating space 53 is formed in an upper surface of the engine housing 50. In a bottom portion of the connector accommodating space 53, furthermore, an opening 54 is formed substantially in a central portion, and a first positioning post receiving opening 51a that receives the first positioning post 22a and a second positioning post receiving opening 51b that receives the second positioning post 22b are formed. Furthermore, four screw receiving openings 52a, 52b, 52c, and 52d are formed in the vicinity of the four corners of the bottom portion of the connector accommodating space 53.

When the electrical connector 1 is to be mounted, the electrical connector 1 is turned over such that the IC package PKG is on the bottom as shown in FIG. 12, and the first positioning post 22a is inserted into the first positioning post receiving opening 51a, while the second positioning post 22b is inserted into the second positioning post receiving opening 51b. In this state, the contact members 35c of the second elastic contact arms 35 of the first contacts 30 and the contact members 45c of the second elastic contact arms 45 of the second contacts 40 protrude upward from the upper surface (this is originally the undersurface, but it has become the upper surface because the electrical connector 1 is turned over) of the base 11 of the electrical connector 1.

Next, as is shown in FIG. 13, a jig 70 is mounted on the circuit board PCB. Here, the circuit board PCB is formed in a rectangular shape, and screw receiving through-holes 61a, 61b, 61c, and 61d are formed in positions respectively corresponding to the screw receiving openings 52a, 52b, 52c, and 52d in the engine housing 50. Moreover, an opening 63 is formed in the circuit board PCB in a position corresponding to the opening 54 in the engine housing 50, and a third positioning post receiving opening 62a and a fourth positioning post receiving opening 62b are formed in positions respectively corresponding to the third positioning post 23a and the fourth positioning post 23b of the electrical connector 1 mounted in the engine housing 50. Meanwhile, the jig 70 is formed in a substantially rectangular shape, and positioning posts 71a and 71b that can be respectively inserted into the screw receiving through-holes 61a and 61b are formed in a protruding manner. In the mounting of the jig 70, the positioning posts 71a and 71b of the jig 70 are respectively inserted into the screw receiving through-holes 61a and 61b in the circuit board PCB.

Figure 14:
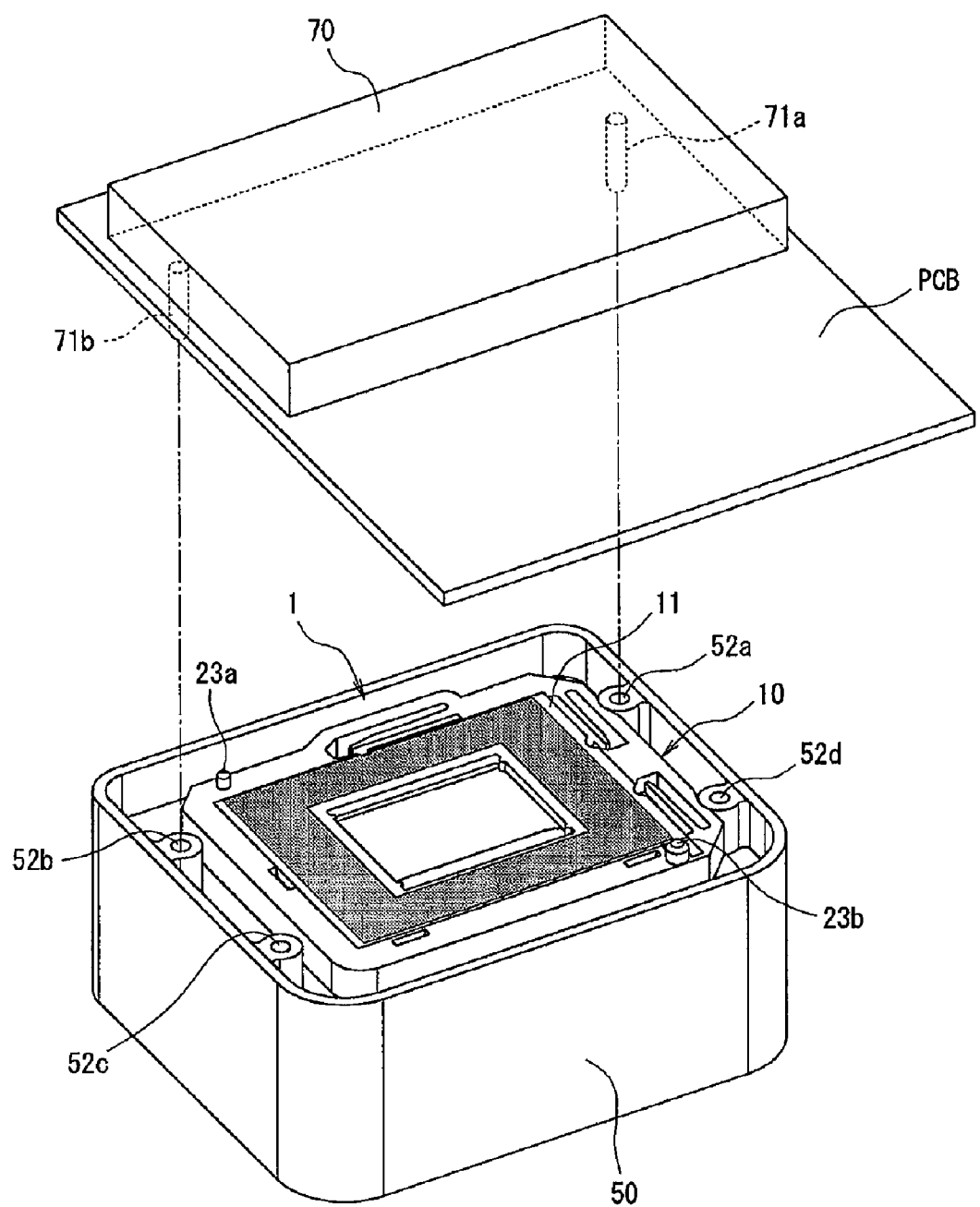
FIG. 14 is a perspective view used to illustrate a method for mounting the circuit board on the engine housing of the optical engine using the jig attached to the circuit board.
Figure 15:
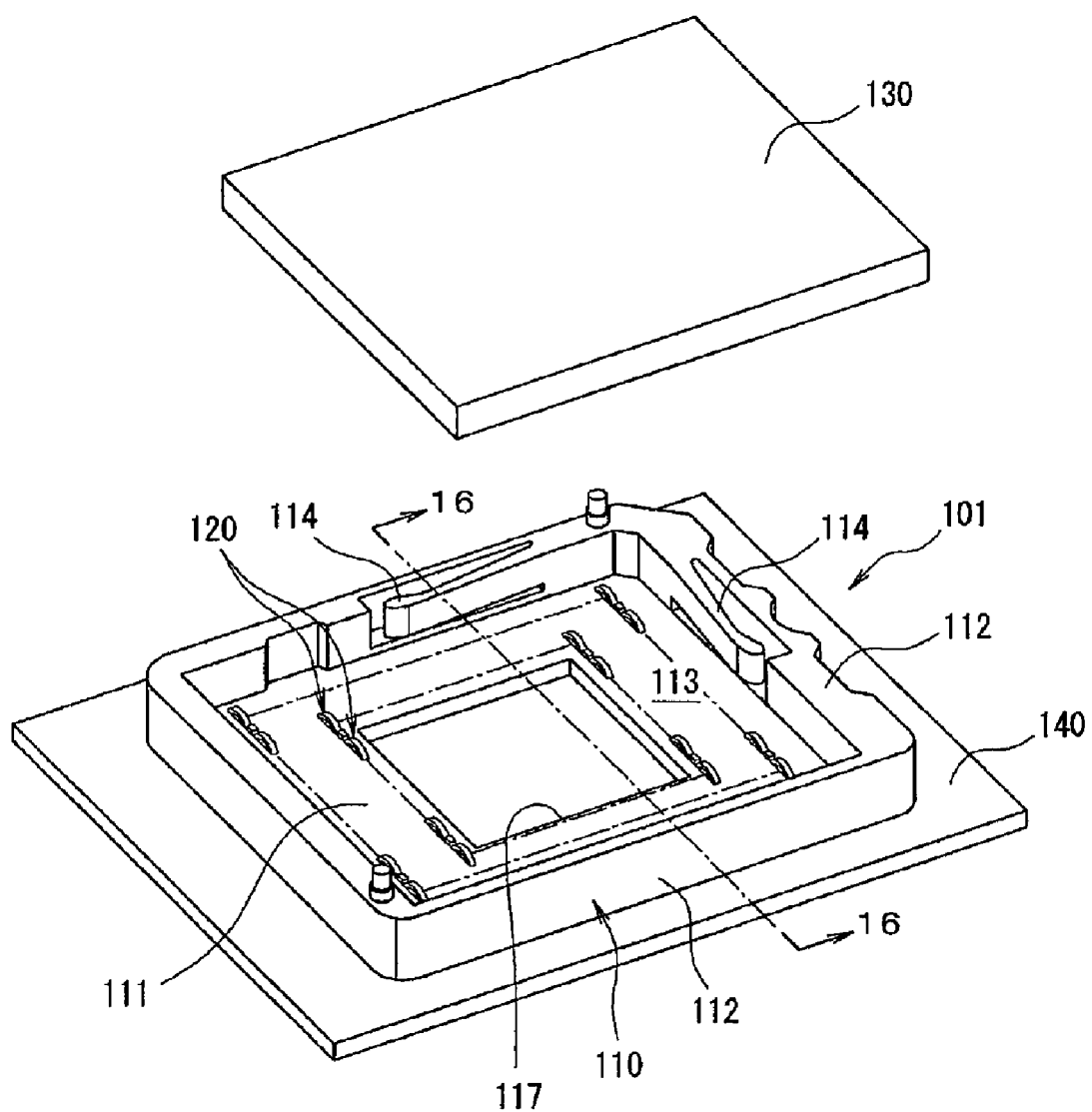
FIG. 15 is a perspective view showing a conventional electrical connector together with an IC package.
Figure 16:
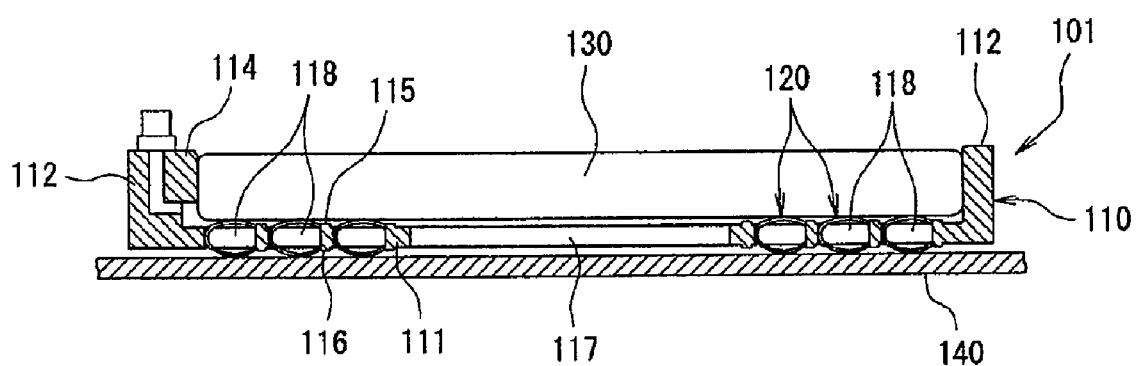
FIG. 16 is a sectional view along line 16-16 in FIG. 15.
Figure 17A:
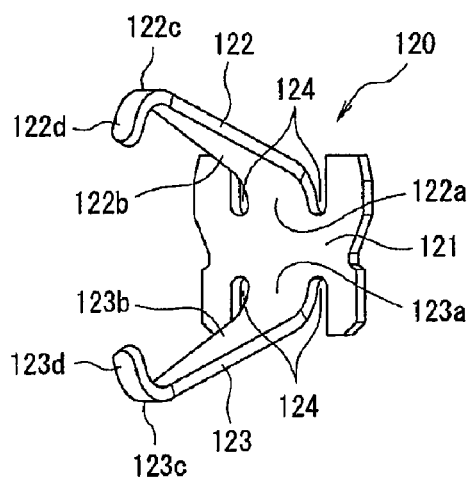
FIGS. 17A, 17B, 17C, 17D, and 17E show a contact used in the electrical connector of FIG. 15, with FIG. 17A being a perspective view as seen from the front at an inclination toward the right side, FIG. 17B being a perspective view as seen from the back at an inclination toward the right side, FIG. 17C being a front view, FIG. 17D being a right side view, and FIG. 17E being a plan view.
Figure 17B:
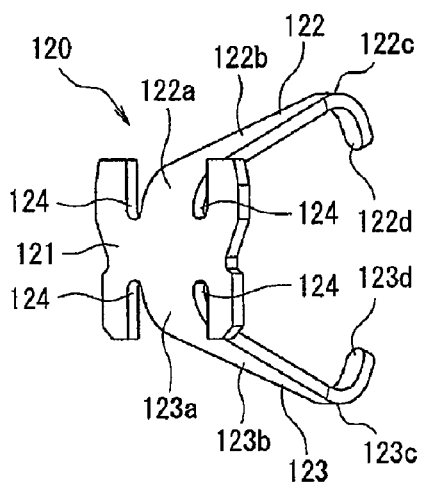
Figure 17C:
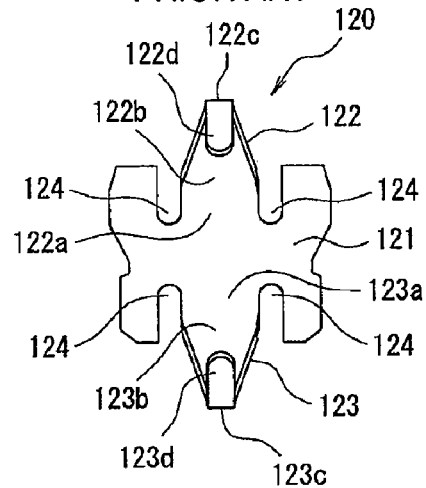
Figure 17D:
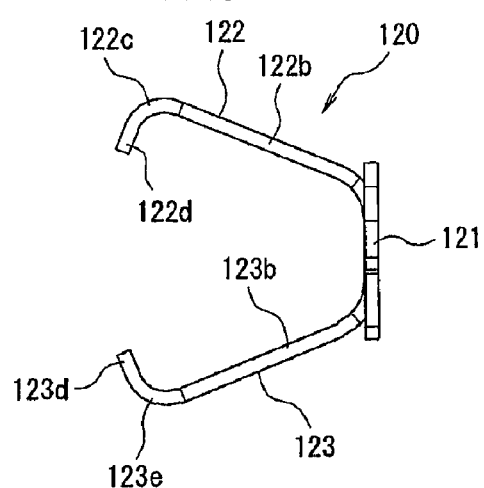
Figure 17E:
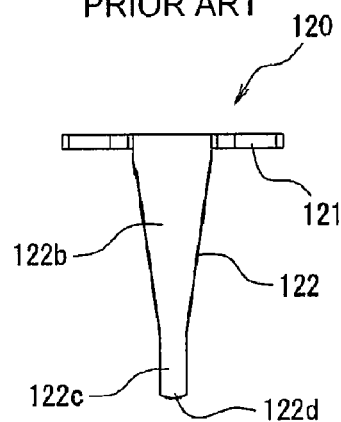

Then, as is shown in FIG. 14, the circuit board PCB is mounted on the engine housing 50 of the optical engine (not shown in the figures) using the jig 70 that is attached to the circuit board PCB. Specifically, the positioning posts 71a and 71b of the jig 70 are respectively inserted into the screw receiving openings 52a and 52b in the engine housing 50, and the third positioning post 23a and the fourth positioning post 23b of the electrical connector 1 are respectively inserted into the third positioning post receiving opening 62a and the fourth positioning post receiving opening 62b in the circuit board PCB. As a result, the circuit board PCB is positioned with respect to the electrical connector 1. Then, the jig 70 is removed, and attachment screws (not shown in the figures) are respectively passed through the screw receiving through-holes 61a, 61b, 61c, and 61d in the circuit board PCB, and are respectively engaged with the screw receiving openings 52a, 52b, 52c, and 52d in the engine housing 50. As a result, the circuit board PCB is mounted on the engine housing 50 of the optical engine, and the IC package PKG is electrically connected to the circuit board PCB in a secure manner.

Here, when the circuit board PCB is mounted on the engine housing 50, the conductive pads (not shown in the figures) provided on the circuit board PCB contact the contact members 35c of the second elastic contact arms 35 of the first contacts 30 and the contact members 45c of the second elastic contact arms 45 of the second contacts 40, and the conductive pads (not shown in the figures) press the contact members 35c and contact members 45c, so that the second elastic contact arms 35 of the first contacts 30 and the second elastic contact arms 45 of the second contacts 40 are elastically deformed downward (in the direction opposite from the direction of arrow A" in FIG. 8). Furthermore, the contact members 35c of the second elastic contact arms 35 of the first contacts 30 and the contact members 45c of the second elastic contact arms 45 of the second contacts 40 are displaced downward. When the contact members 35c and the contact members 45c are displaced downward, the linking members 32 that are linked to the first elastic contact arms 34 and the second elastic contact arms 35 of the first contacts 30 and the linking members 42 that are linked to the first elastic contact arms 44 and the second elastic contact arms 45 of the second contacts 40 respectively undergo elastic deformation with forces smaller than the pressing forces applied to the contact members 35c and the contact members 45c, so that the pressing forces applied to the contact members 35c of the second elastic contact arms 35 and the contact members 45c of the second elastic contact arms 45 on one side are respectively transmitted to the contact members 34c of the first elastic contact arms 34 and the contact members 44c of the first elastic contact arms 44 on the other side. As a result, the contact members 34c of the first elastic contact arms 34 of the first contacts 30 and the contact members 44c of the first elastic contact arms 44 of the second contacts 40 are displaced downward.

Therefore, even in cases where the IC package PKG or the circuit board PCB is warped or deformed for some reason, when the conductive pads (not shown in the figures) provided on the IC package PKG contact and press the contact members 34c of the first elastic contact arms 34 of the first contacts 30 and the contact members 44c of the first elastic contact arms 44 of the second contacts 40, and the conductive pads (not shown in the figures) provided on the circuit board PCB contact and press the contact members 35c of the second elastic contact arms 35 of the first contacts 30 and the contact members 45c of the second elastic contact arms 45 of the second contacts 40, the linking members 32 and 42 respectively undergo elastic deformation with forces smaller than the pressing forces of the conductive pads (not shown in the figures), so that the pressing forces applied to the contact members 34c and 44c or the contact members 35c and 45c on one side are respectively transmitted to the contact members 35c and 45c or the contact members 34c and 44c on the other side. Accordingly, desired amounts of flexing of the first elastic contact arms 34 and 44 and the second elastic contact arms 35 and 45 in the vertical direction are obtained, and desired amounts of elastic force of the first elastic contact arms 34 and 44 and the second elastic contact arms 35 and 45 are obtained as a result, so that appropriate amounts of contact pressure are imparted to the contact members 34c and 44c of the first elastic contact arms 34 and 44 and the contact members 35c and 45c of the second elastic contact arms 35 and 45. Consequently, it is possible to increase the contact reliability of the contact members 34c and 44c of the first elastic contact arms 34 and 44 that contact the conductive pads (not shown in the figures) of the IC package PKG and the contact members 35c and 45c of the second elastic contact arms 35 and 45 that contact the conductive pads (not shown in the figures) of the circuit board PCB.

Furthermore, the bevels 35d and 45d are respectively applied to the corner portions of the two side surfaces of the contact members 35c of the second elastic contact arms 35 of the first contacts 30 and the corner portions of the two side surfaces of the contact members 45c of the second elastic contact arms 45 of the second contacts 40. Therefore, when the conductive pads (not shown in the figures) provided on the circuit board PCB contact the contact members 35c and 45c of the second elastic contact arms 35 and 45, the portions of the bevels 35d and 45d that are respectively applied to the corner portions of the two side surfaces of the contact members 35c and 45c of the second elastic contact arms 35 and 45 can prevent the contact members 35c and 45c and the conductive pads (not shown in the figures) from catching each other in cases where the circuit board PCB is rotated or slid, and an external force is applied to the contact members 35c and 45c from the conductive pads (not shown in the figures). Because the conductive pads (not shown in the figures) protrude slightly from the main surface of the circuit board PCB, the conductive pads (not shown in the figures) tend to be caught by the contact members 35c of the second elastic contact arms 35 of the first contacts 30 and the contact members 45c of the second elastic contact arms 45 of the second contacts 40.

Meanwhile, on the side of the first elastic contact arms 34 and 44, when the IC package PKG is accommodated in the package accommodating space 14 of the electrical connector 1, the projection 19a of the first elastic arm 19 is designed to contact a side edge of the IC package PKG, and to push the IC package PKG toward the side wall 12b located on the opposite side of the side wall 12a on which the first elastic arm 19 is provided, and the projections 20a of the second elastic arms 20 are designed to contact an end edge of the IC package PKG, and to push the IC package PKG toward the end wall 13b located on the opposite side of the end wall 13a on which the second elastic arms 20 are provided. Therefore, there is no danger that an external force will be applied to the contact members 34c and 44c from the conductive pads (not shown in the figures) of the IC package PKG because of the IC package PKG being rotated or slid. However, even in the case of a construction in which the IC package PKG can be rotated or slid, because the bevels 34d and 44d are also respectively applied to the corner portions of the two side surfaces of the contact members 34c of the first elastic contact arms 34 of the first contacts 30 and the corner portions of the two side surfaces of the contact members 44c of the first elastic contact arms 44 of the second contacts 40, it is possible to prevent the contact members 34c and 44c and the conductive pads (not shown in the figures) from catching each other. Because the conductive pads protrude slightly from the main surface of the IC package PKG, the conductive pads (not shown in the figures) tend to be caught by the contact members 34c of the first elastic contact arms 34 of the first contacts 30 and the contact members 44c of the first elastic contact arms 44 of the second contacts 40.

Furthermore, the anti-slipping pieces 35e are respectively provided at the tip ends of the contact members 35c of the second elastic contact arms 35 of the first contacts 30, with the anti-slipping pieces 35e preventing the tip ends of the contact members 35c from slipping out of the first contact accommodating cavities 16 by contacting the contact projections 16b provided on the base 11 of the housing 10. Moreover, the anti-slipping pieces 45e are respectively provided at the tip ends of the contact members 45c of the second elastic contact arms 45 of the second contacts 40, with the anti-slipping pieces 45e preventing the tip ends of the contact members 45c from slipping out of the second contact accommodating cavities 17 by contacting the projections (not shown in the figures) provided on the base 11 of the housing 10. As a result, even in cases where an external force is applied to the contact members 35c and 45c from the conductive pads (not shown in the figures) because of the circuit board PCB being rotated or slid when the conductive pads (not shown in the figures) provided on the circuit board PCB contact the contact members 35c and 45c of the second elastic contact arms 35 and 45, the anti-slipping pieces 35e and 45e can respectively prevent the tip ends of the contact members 35c and 45c from slipping out of the first and second contact accommodating cavities 16 and 17 by contacting the contact projections 16b (not shown in the figures) of the housing 10, thus preventing the deformation of the second elastic contact arms 35 and 45.

Incidentally, anti-slipping pieces 35e and 45e are provided at the tip ends of the contact members 34c of the first elastic contact arms 34 of the first contacts 30 or at the tip ends of the contact members 44c of the first elastic contact arms 44 of the second contacts 40. This is because there is little risk of the IC package PKG being rotated or slid when the conductive pads (not shown in the figures) provided on the IC package PKG contact the contact members 34c and 44c of the first elastic contact arms 34 and 44.

An embodiment of the present invention has been described above. However, the present invention is not limited to this embodiment, and various alterations and modifications can be made.

For example, with regard to the first contacts 30, the bevels 34d and 35d are respectively applied to the corner portions of the two side surfaces of the contact members 34c of the first elastic contact arms 34 and the corner portions of the two side surfaces of the contact members 35c of the second elastic contact arms 35. However, it would also be possible to apply the bevels 34d only to the corner portions of the two side surfaces of the contact members 34c of the first elastic contact arms 34, or apply the bevels 35d only to the corner portions of the two side surfaces of the contact members 35c of the second elastic contact arms 35. For instance, it would be effective to apply the bevels 34d only to the corner portions of the two side surfaces of the contact members 34c of the first elastic contact arms 34 when only the IC package PKG is made to be rotatable or slidable, and to apply the bevels 35d only to the corner portions of the two side surfaces of the contact members 35c of the second elastic contact arms 35 when only the circuit board PCB is made to be rotatable or slidable.

Furthermore, with regard to the second contacts 40, the bevels 44d and 45d are respectively applied to the corner portions of the two side surfaces of the contact members 44c of the first elastic contact arms 44 and the corner portions of the two side surfaces of the contact members 45c of the second elastic contact arms 45. However, it would also be possible to apply the bevels 44d only to the corner portions of the two side surfaces of the contact members 44c of the first elastic contact arms 44, or apply the bevels 45d only to the corner portions of the two side surfaces of the contact members 45c of the second elastic contact arms 45. For instance, it would be effective to apply the bevels 44d only to the corner portions of the two side surfaces of the contact members 44c of the first elastic contact arms 44 when only the IC package PKG is made to be rotatable or slidable, and to apply the bevels 45d only to the corner portions of the two side surfaces of the contact members 45c of the second elastic contact arms 45 when only the circuit board PCB is made to be rotatable or slidable.

Moreover, in the first contacts 30, the anti-slipping pieces 35e are respectively provided only at the tip ends of the contact members 35c of the second elastic contact arms 35. However, the anti-slipping pieces 35e may be provided only at the tip ends of the contact members 34c of the first elastic contact arms 34, or the anti-slipping pieces 35e may also be provided both at the tip ends of the contact members 34c of the first elastic contact arms 34 and at the tip ends of the contact members 35c of the second elastic contact arms 35. For example, it would be effective to provide the anti-slipping pieces 35e only at the tip ends of the contact members 34c of the first elastic contact arms 34 when only the IC package PKG is made to be rotatable or slidable, and to provide the anti-slipping pieces 35e both at the tip ends of the contact members 34c of the first elastic contact arms 34 and at the tip ends of the contact members 35c of the second elastic contact arms 35 when both the IC package PKG and the circuit board PCB are made to be rotatable or slidable.

In addition, in the second contacts 40, the anti-slipping pieces 45e are respectively provided only at the tip ends of the contact members 45c of the second elastic contact arms 45. However, the anti-slipping pieces 45e may be provided only at the tip ends of the contact members 44c of the first elastic contact arms 44, or the anti-slipping pieces 45e may also be provided both at the tip ends of the contact members 44c of the first elastic contact arms 44 and at the tip ends of the contact members 45c of the second elastic contact arms 45. For example, it would be effective to provide the anti-slipping pieces 45e only at the tip ends of the contact members 44c of the first elastic contact arms 44 when only the IC package PKG is made to be rotatable or slidable, and to provide the anti-slipping pieces 45e both at the tip ends of the contact members 44c of the first elastic contact arms 44 and at the tip ends of the contact members 45c of the second elastic contact arms 45 when both the IC package PKG and the circuit board PCB are made to be rotatable or slidable.

Furthermore, the linking members 32 in the first contacts 30 respectively extend in the direction perpendicular to the main surfaces of the base plates 31. However, as long as the linking members 32 extend in a direction that respectively intersects with the main surfaces of the base plates 31, this direction is not necessarily limited to the perpendicular direction. Moreover, the linking members 42 in the second contacts 40 also respectively extend in the direction perpendicular to the main surfaces of the base plates 41. However, as long as the linking members 42 extend in the opposite direction of the linking members 32, this direction is not necessarily limited to the perpendicular direction.

What is claimed is:

1. A contact, comprising:
   a substantially rectangular base plate;
   a linking member extending from the base plate such that the linking member is perpendicular thereto;
   a first elastic contact arm that extends obliquely upward from a tip end of the linking member, the first elastic contact arm having a contact member for electrically connecting the first elastic contact arm to an integrated circuit socket; and
   a second elastic contact arm that extends obliquely downward from a tip end of the linking member, the second elastic contact arm having a contact member for electrically connecting the second elastic contact arm to a circuit board;
   wherein the base plate has cutouts extending perpendicular to the linking member, the linking member extending from the base plate at a position between the cutouts.

2. The contact of claim 1, wherein an anti-slipping piece extends from the contact member of the second elastic contact arm.

3. The contact of claim 1, wherein side surfaces of the contact member of the first elastic contact arm has bevels.

4. The contact of claim 1, wherein side surfaces of the contact member of the second elastic contact arm has bevels.

5. The contact of claim 1, wherein the contact member of the first elastic contact arm and the contact member of the second elastic contact arm is curved.

6. The contact of claim 1, wherein the base plate includes press-fitting members.

* * * * *